United States Patent
Choi et al.

(10) Patent No.: US 11,474,565 B2
(45) Date of Patent: Oct. 18, 2022

(54) MOBILE TERMINAL

(71) Applicant: LG ELECTRONICS INC., Seoul (KR)

(72) Inventors: Hakho Choi, Seoul (KR); Seounghwan Seol, Seoul (KR); Sungdo Kim, Seoul (KR); Jiwoong Yang, Seoul (KR); Sangwook Park, Seoul (KR); Minchul Lee, Seoul (KR); Jeeho Yom, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/123,508

(22) Filed: Dec. 16, 2020

(65) Prior Publication Data

US 2022/0026954 A1    Jan. 27, 2022

(30) Foreign Application Priority Data

Jul. 24, 2020  (WO) ................ PCT/KR2020/009764

(51) Int. Cl.
*G06F 1/16* (2006.01)
*H05K 7/18* (2006.01)

(52) U.S. Cl.
CPC .......... *G06F 1/1652* (2013.01); *G06F 1/1656* (2013.01); *H05K 7/183* (2013.01)

(58) Field of Classification Search
CPC ... G06F 1/1624; G06F 1/1652; H04M 1/0237
See application file for complete search history.

(56) References Cited

U.S. PATENT DOCUMENTS 6,483,445 B1 * 11/2002 England .............. H04M 1/0208
                                                      341/20
6,997,525 B2 * 2/2006 Gillengerten .......... A47B 81/06
                                                      348/E5.13
(Continued)

FOREIGN PATENT DOCUMENTS

CN      208128703      11/2018
EP       1675359        6/2006
(Continued)

OTHER PUBLICATIONS

PCT International Application No. PCT/KR2020/009764, International Search Report dated Apr. 22, 2021, 9 pages.

(Continued)

*Primary Examiner* — Adrian S Wilson
(74) *Attorney, Agent, or Firm* — Lee, Hong, Degerman, Kang & Waimey PC

(57) ABSTRACT

A mobile terminal comprises a first frame, a second frame capable of slidably moving from the first frame in a first direction or a second direction which is an opposite direction of the first direction, and a driving unit slidably moving the second frame, wherein the driving unit includes a motor coupled to the first frame, a pinion gear rotated by a rotational force transferred from the motor, a gear rack extended in the first direction and coupled to the second frame, moving in the first direction or the second direction when the pinion gear is rotated, a guide rail coupled with the gear rack, and a guide block coupled to the first frame, moving along the guide rail.

12 Claims, 14 Drawing Sheets

(56) References Cited

U.S. PATENT DOCUMENTS

| | | | | |
|---|---|---|---|---|
| 7,107,018 B2* | 9/2006 | Jellicoe | H04M 1/23 | 455/90.3 |
| 7,262,761 B1* | 8/2007 | Duarte | H04M 1/2748 | 379/93.23 |
| 7,353,053 B2* | 4/2008 | Prichard | H04M 1/0237 | 455/90.3 |
| 7,610,069 B2* | 10/2009 | Kwak | G06F 1/1677 | 455/566 |
| 8,938,276 B2* | 1/2015 | Kwak | G06F 1/1671 | 455/566 |
| 2005/0054398 A1* | 3/2005 | Kim | H04M 1/0237 | 455/575.4 |
| 2005/0064921 A1* | 3/2005 | Jeong | H04M 1/0245 | 455/575.4 |
| 2006/0135229 A1* | 6/2006 | Kwak | H04M 1/0237 | 455/575.4 |
| 2007/0108791 A1* | 5/2007 | Okninski | A47B 81/064 | 296/97.12 |
| 2016/0363960 A1* | 12/2016 | Park | G09F 9/301 | |
| 2018/0125228 A1* | 5/2018 | Porter | H05K 5/0017 | |
| 2020/0033913 A1* | 1/2020 | Yang | G06F 1/1624 | |

FOREIGN PATENT DOCUMENTS

| | | |
|---|---|---|
| EP | 3525433 | 8/2019 |
| KR | 101349438 | 11/2008 |
| KR | 1020190101605 | 9/2019 |
| KR | 1020190113128 | 10/2019 |
| KR | 1020200013821 | 2/2020 |

OTHER PUBLICATIONS

European Patent Office Application Serial No. 20214876.3, Search Report dated Jun. 9, 2021, 7 pages.

* cited by examiner

FIG. 6
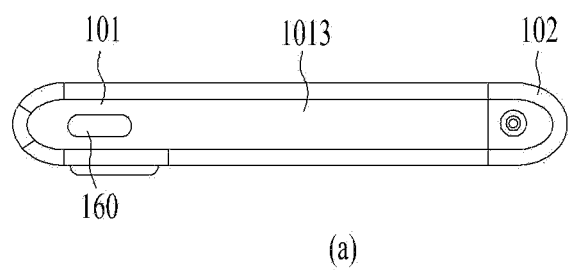
(a)
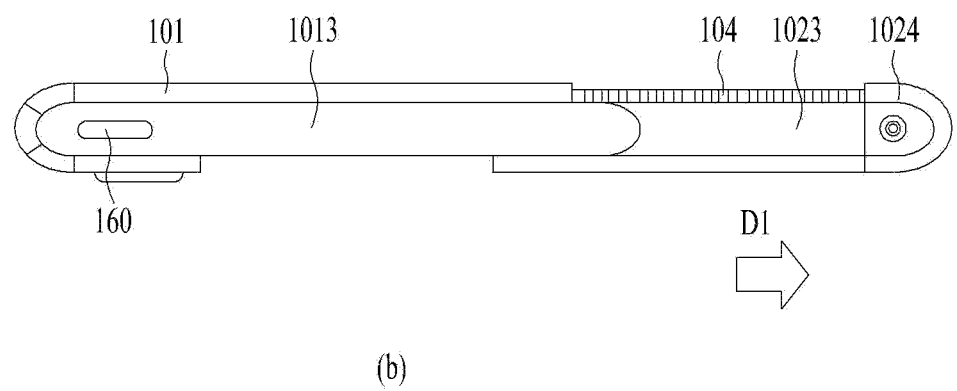
(b)

FIG. 7
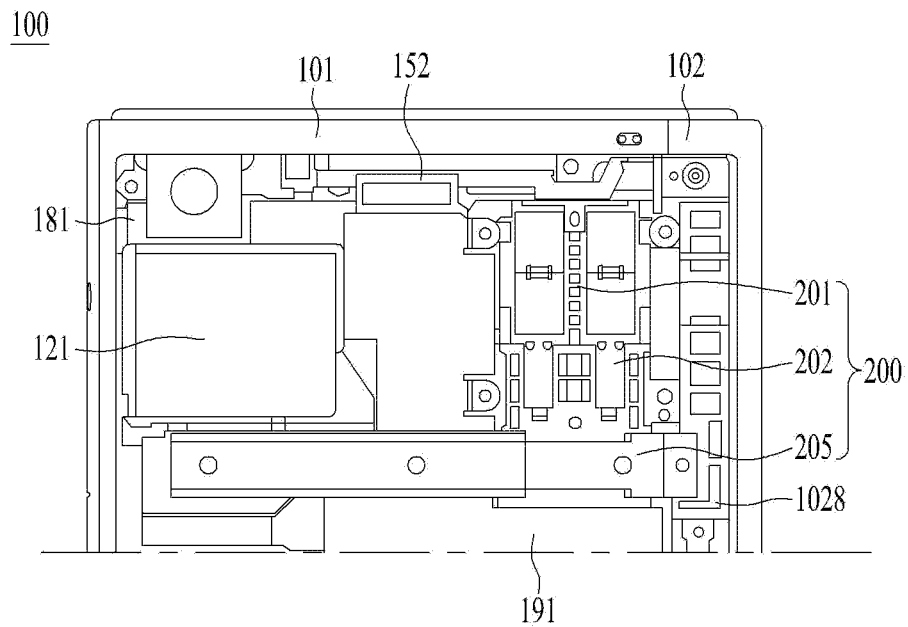
(a)
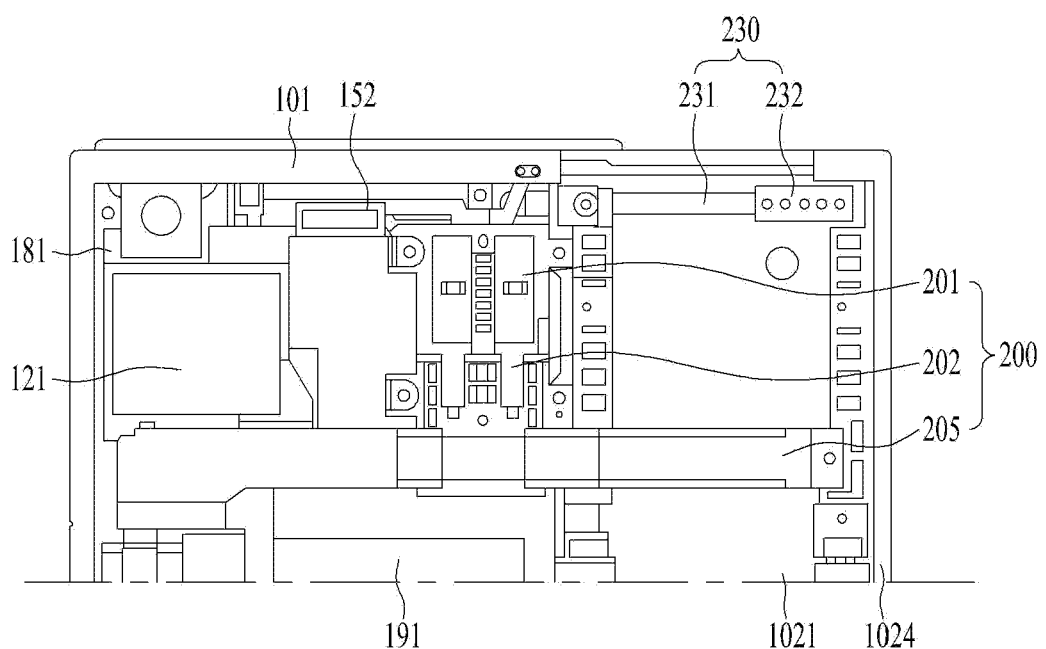
(b)

FIG. 8
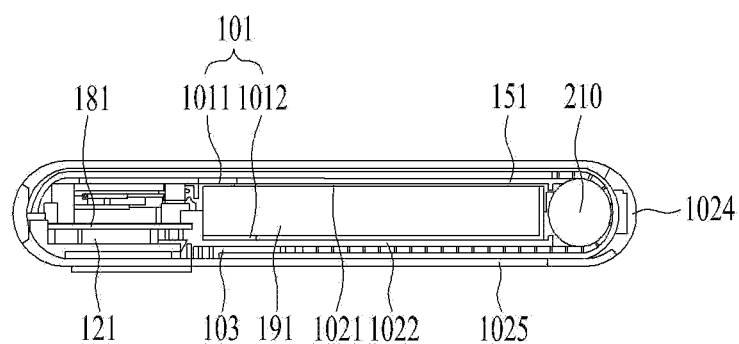
(a)
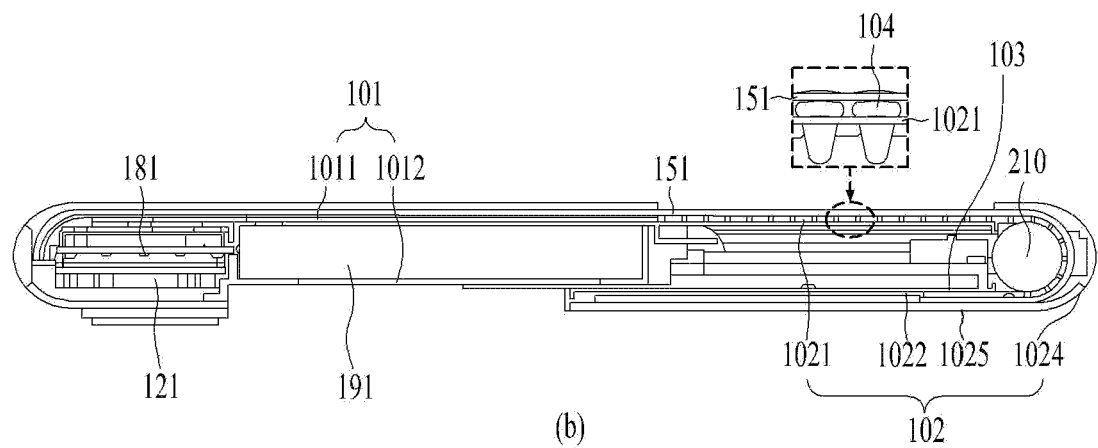
(b)

(a)  (b)

FIG. 11
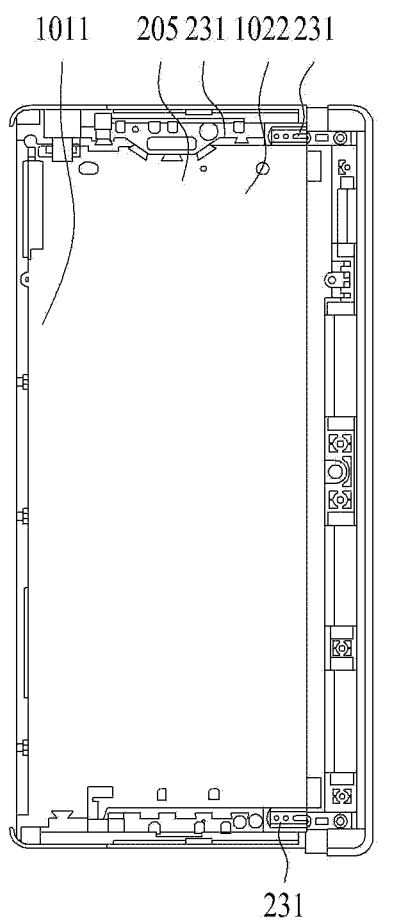
(a)
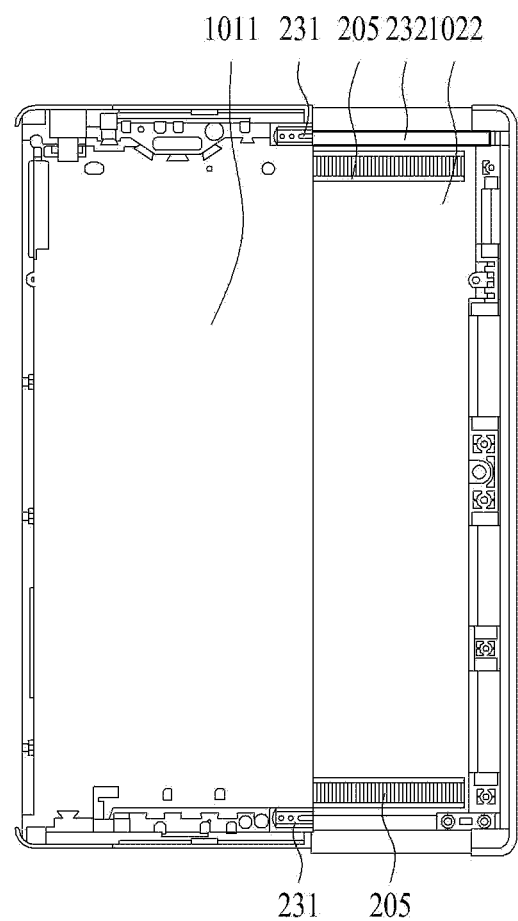
(b)

FIG. 12
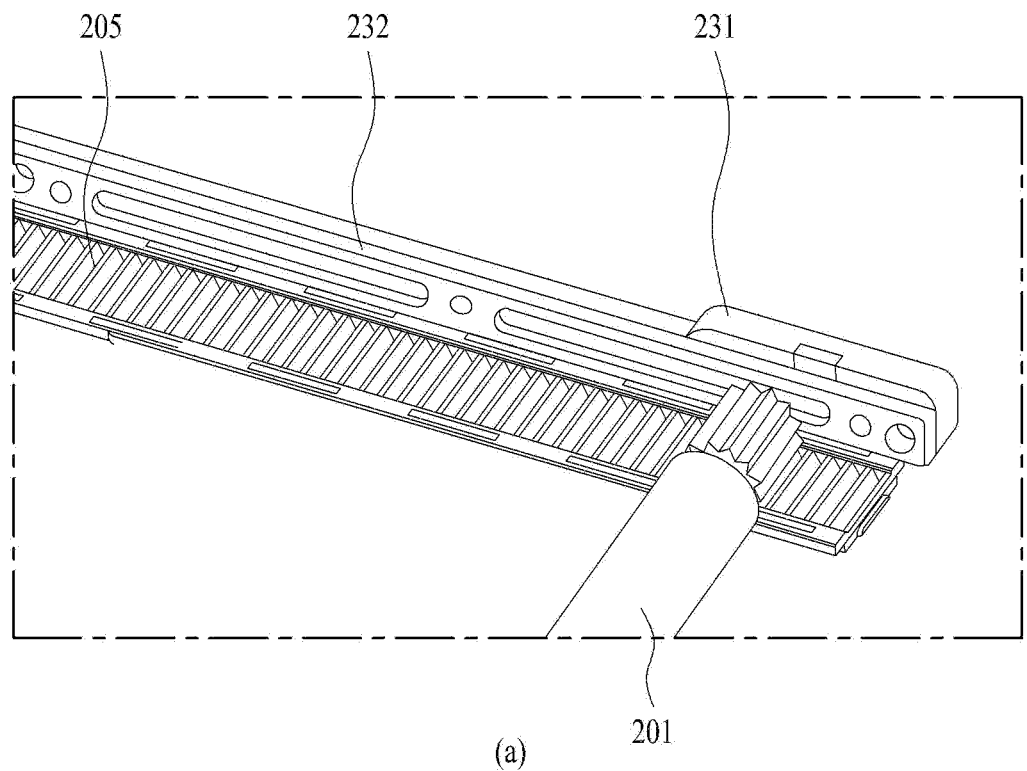
(a)
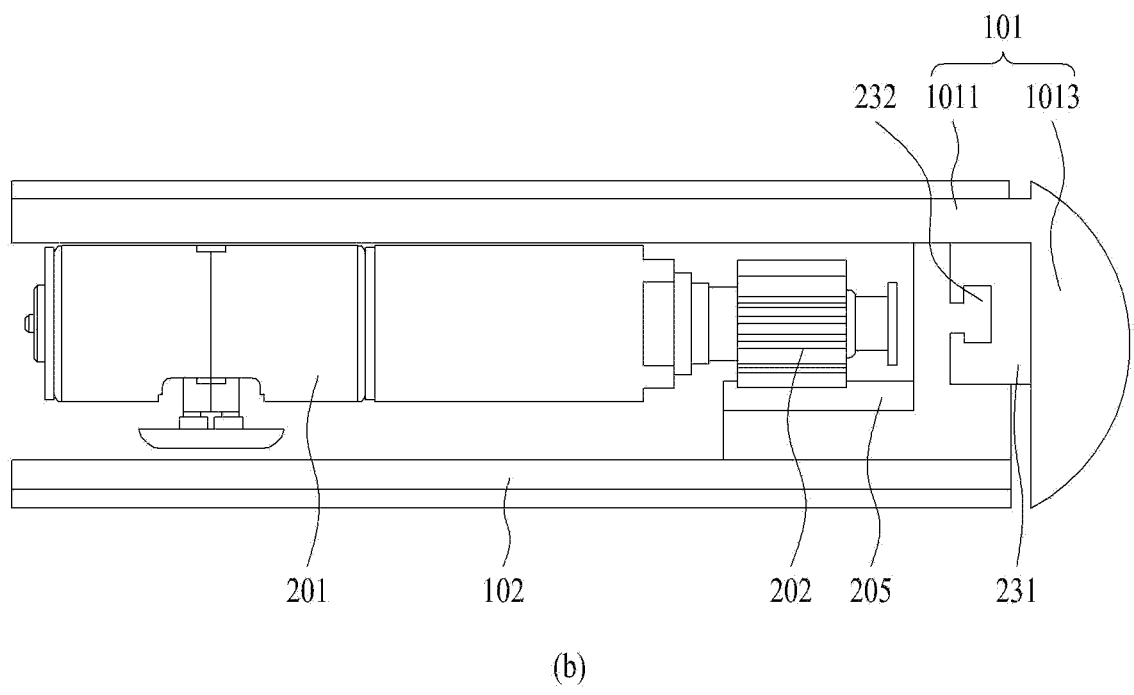
(b)

FIG. 13
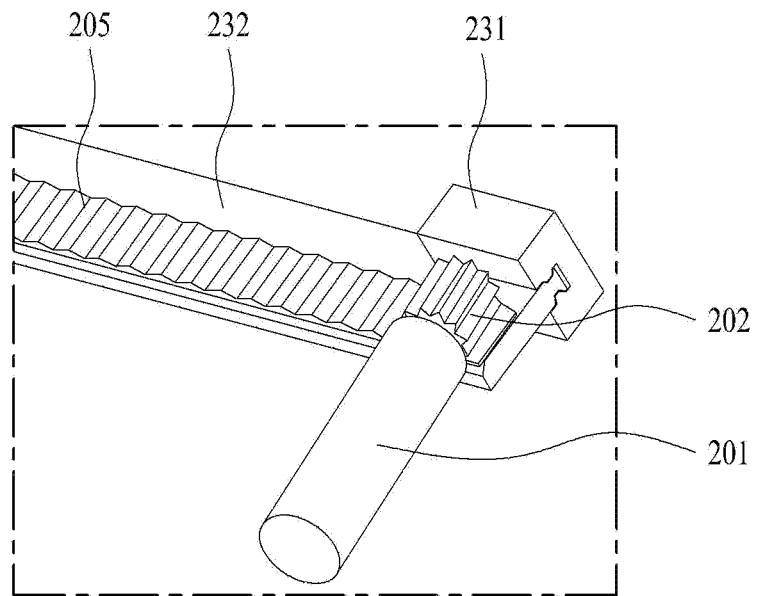
(a)
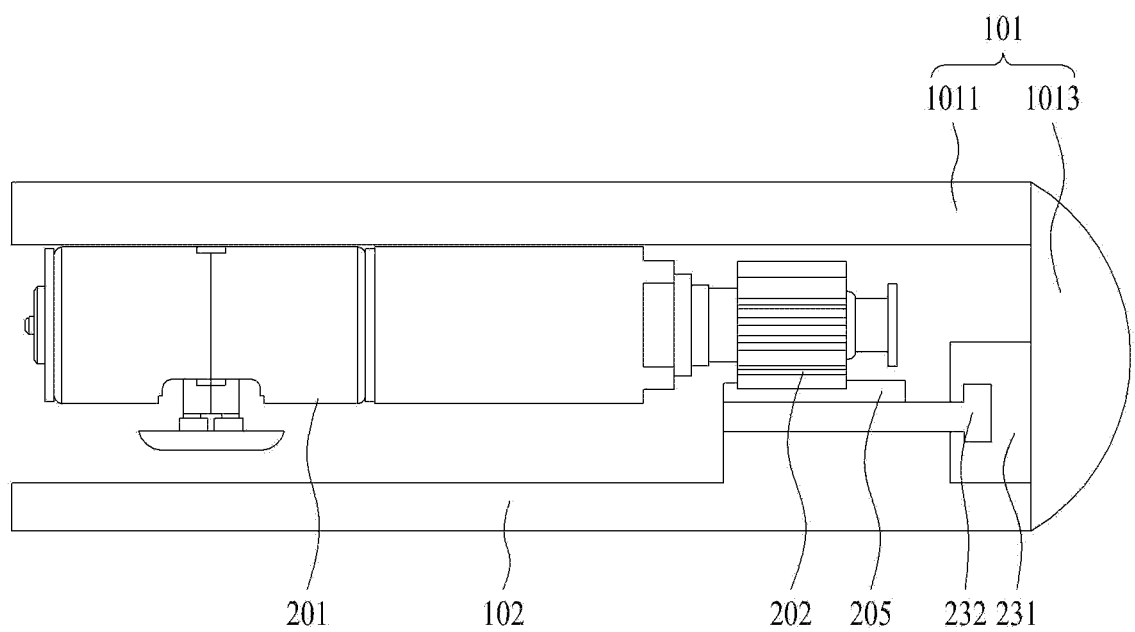
(b)

MOBILE TERMINAL

CROSS-REFERENCE TO RELATED APPLICATIONS

Pursuant to 35 U.S.C. § 119, this application claims the benefit of an earlier filing date and right of priority to International Application No. PCT/KR2020/009764, filed on Jul. 24, 2020, the contents of which are hereby incorporated by reference herein in its entirety.

BACKGROUND OF THE INVENTION

Field of the Invention

The present disclosure relates to a mobile terminal, and more particularly, to a mobile terminal that has a flexible display and is capable of extending a size of a screen while the display is scrolled and slid at the same time.

Discussion of the Related Art

Terminals may be generally classified as mobile/portable terminals or stationary terminals according to their mobility. Mobile terminals may also be classified as handheld terminals or vehicle mounted terminals according to whether or not a user can directly carry the terminal.

In recent years, because of a development of a broadcasting technology and a network technology, functions of the display device have also been considerably diversified, and a performance of the device has been improved accordingly. That is, the display device has been developed to provide not only broadcast contents but also various other contents to the user. For example, the display device may provide game play, music listening, interne shopping, user customized information, and the like using various applications as well as programs received from the broadcasting station. In order to perform such extended functions, the display device may be basically connected to other devices or networks using various communication protocols, and may provide the user with a ubiquitous computing environment. In other words, the display device has evolved into a smart device that enables connectivity to a network and continuous computing.

Recently, a flexible display having sufficient elasticity and capable of large deformation has been developed. The size of a mobile terminal can be varied using the deformable nature of the flexible display. For the mobile terminal having such a variable structure, changing the size of the mobile terminal should be stably performed, and there is a need for a structure to support the extended display unit to maintain a flat state of the display unit.

SUMMARY OF THE INVENTION

Accordingly, the present disclosure is directed to a mobile terminal that substantially obviates one or more problems due to limitations and disadvantages of the related art.

One object of the present disclosure is to provide a mobile terminal in which a slide of a frame moves stably without distortion to enable a natural state change.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a mobile terminal comprises a first frame, a second frame configured to slidably move with respect to the first frame in a first direction or a second direction which is an opposite direction of the first direction, and a driving unit slidably moving the second frame, wherein the driving unit includes a motor coupled to the first frame, a pinion gear rotated by a rotational force transferred from the motor, a gear rack extended in the first direction and coupled to the second frame, moving in the first direction or the second direction when the pinion gear is rotated, a guide rail coupled with the gear rack, and a guide block coupled to the first frame wherein the guide rail is engaged with the guide block and configured to pass through the guide block according to movement of the gear rack in response to the rotation of the pinion gear.

The driving unit may be provided with a pair of driving units disposed to be spaced apart from each other in a third direction vertical to the first direction.

The pair of driving units may be disposed to be symmetrical to each other.

The motor and the guide block may be disposed to adjoin an end portion of the first direction of the first frame.

The gear rack may have sawteeth headed for a rear direction of the mobile terminal, the guide rail may be coupled to the gear rack toward a front direction of the mobile terminal, and the guide block, the guide rail, the gear rack and the pinion gear may be disposed to overlap one another from the front direction to the rear direction of the mobile terminal.

The guide block may include a guide groove having a shape corresponding to that of the guide rail.

The guide rail may further include an extended portion protruded in the third direction vertical to the first direction, the guide groove may further include an extended groove of a shape corresponding to the extended portion, and the extended portion and the extended groove may prevent the guide rail and the guide block from being detached from each other.

The guide block may be coupled to the side portion of the first frame frame such that a first engagement portion of the guide block faces a lateral direction, and the guide rail may be disposed to such that a second engagement portion of the guide rail faces the guide block and coupled with the gear rack is positioned perpendicular to the guide rail such that teeth of the gear rack face toward a front or a rear of the mobile terminal.

The guide block may include a bearing ball or polyoxymethylene (POM) arranged to adjoin the guide rail.

The mobile terminal may further comprise a slide frame capable of moving in the first direction or the second direction with respect to the second frame, and a flexible display unit including a first region coupled to the first frame, a second region coupled to the slide frame and a third region arranged between the first region and the second region and bent by surrounding the second frame.

Since the mobile terminal of the present disclosure may control a size of a screen if necessary, both portability and usability may be fulfilled.

Also, since the mobile terminal of the present disclosure does not concentrate a stress on a specific point, a damage caused by a concentrated stress of the display unit may be reduced.

Also, since a gap of the display unit is prevented from occurring when the second frame moves, the display unit of a flat state may be maintained.

Also, the mobile terminal of the present disclosure includes a structure that guides the second frame and the slide frame to allow them to move in parallel, whereby distortion may be avoided.

Further scope of applicability of the present disclosure will become apparent from the detailed description given hereinafter. However, it should be understood that the detailed description and specific examples, while indicating preferred embodiments of the disclosure, are given by illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings, which are given by illustration only, and thus are not limitative of the present disclosure, and wherein:

FIG. 6 is a side view of the mobile terminal as viewed from a third direction;

FIG. 7 is a view showing a driving unit of the mobile terminal in accordance with an embodiment;

FIG. 8 is a cross-sectional view taken along lines A-A and B-B in FIG. 2;

FIG. 11 is a front view of FIG. 10;

FIG. 12 is a view illustrating one embodiment of the driving unit of the mobile terminal;

FIG. 13 is a view illustrating another embodiment of the driving unit of the mobile terminal.

DETAILED DESCRIPTION OF THE INVENTION

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Figure 1:
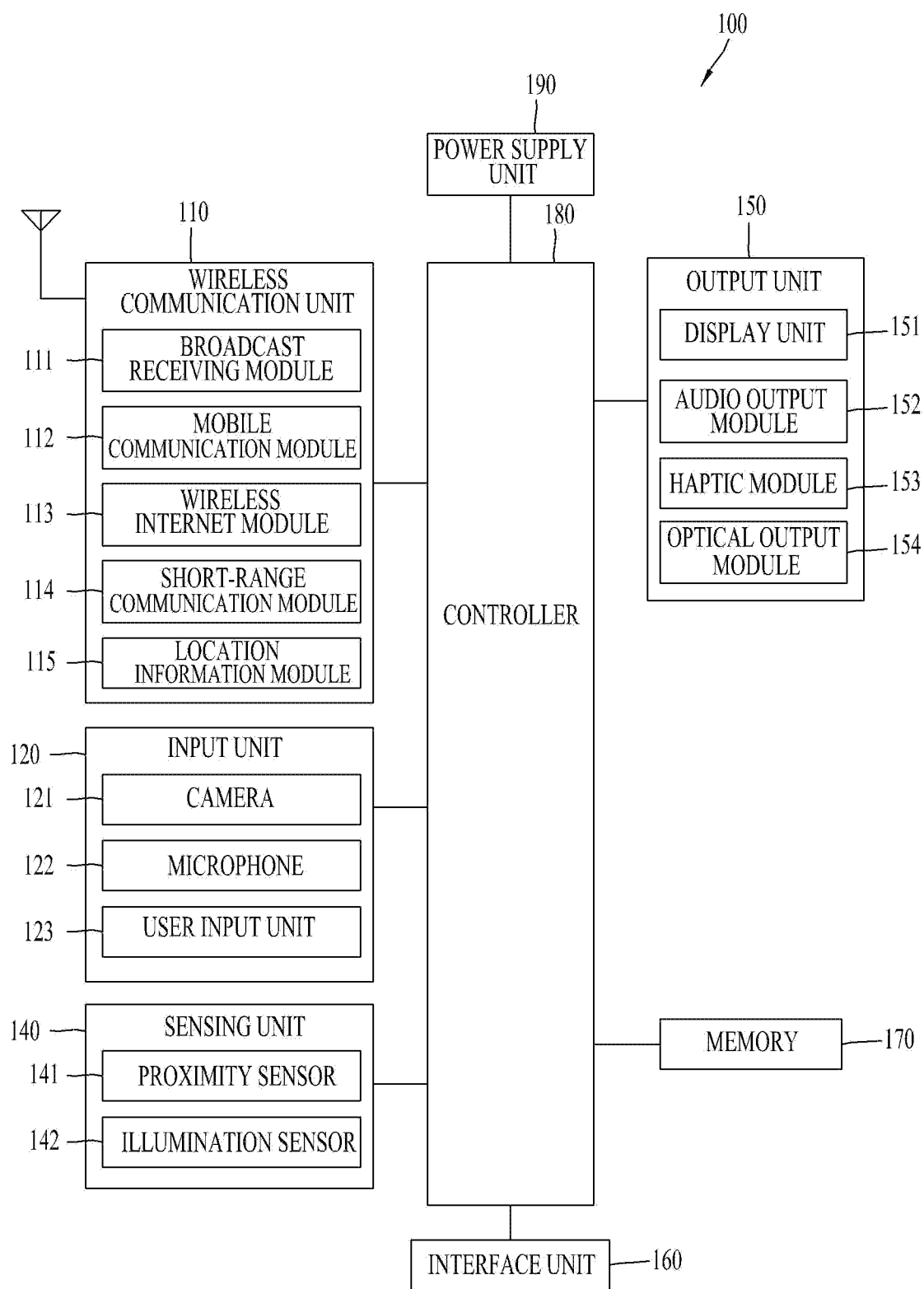
FIG. 1 is a block diagram of a mobile terminal in accordance with the present disclosure.

FIG. 1 is a block diagram of a mobile terminal in accordance with the present disclosure.

The mobile terminal 100 is shown having components such as a wireless communication unit 110, an input unit 120, a sensing unit 140, an output unit 150, an interface unit 160, a memory 170, a controller 180, and a power supply unit 190. Referring now to FIG. 1, the mobile terminal 100 is shown having wireless communication unit 110 configured with several commonly implemented components. It is understood that implementing all of the illustrated components is not a requirement, and that greater or fewer components may alternatively be implemented.

More specifically, the wireless communication unit 110 typically includes one or more modules which permit communications such as wireless communications between the mobile terminal 100 and a wireless communication system, communications between the mobile terminal 100 and another mobile terminal, communications between the mobile terminal 100 and an external server. Further, the wireless communication unit 110 typically includes one or more modules which connect the mobile terminal 100 to one or more networks.

To facilitate such communications, the wireless communication unit 110 includes one or more of a broadcast receiving module 111, a mobile communication module 112, a wireless Internet module 113, a short-range communication module 114, and a location information module 115.

Regarding the wireless communication unit 110, the broadcast receiving module 111 is typically configured to receive a broadcast signal and/or broadcast associated information from an external broadcast managing entity via a broadcast channel. The broadcast channel may include a satellite channel, a terrestrial channel, or both. In some embodiments, two or more broadcast receiving modules 111 may be utilized to facilitate simultaneously receiving of two or more broadcast channels, or to support switching among broadcast channels.

The mobile communication module 112 can transmit and/or receive wireless signals to and from one or more network entities. Typical examples of a network entity include a base station, an external mobile terminal, a server, and the like. Such network entities form part of a mobile communication network, which is constructed according to technical standards or communication methods for mobile communications (for example, Global System for Mobile Communication (GSM), Code Division Multi Access (CDMA), CDMA2000 (Code Division Multi Access 2000), EV-DO (Enhanced Voice-Data Optimized or Enhanced Voice-Data Only), Wideband CDMA (WCDMA), High Speed Downlink Packet access (HSDPA), HSUPA (High Speed Uplink Packet Access), Long Term Evolution (LTE), LTE-A (Long Term Evolution-Advanced), and the like).

Examples of wireless signals transmitted and/or received via the mobile communication module 112 include audio call signals, video (telephony) call signals, or various formats of data to support communication of text and multimedia messages.

The wireless Internet module 113 is configured to facilitate wireless Internet access. This module may be internally or externally coupled to the mobile terminal 100. The wireless Internet module 113 may transmit and/or receive wireless signals via communication networks according to wireless Internet technologies.

Examples of such wireless Internet access include Wireless LAN (WLAN), Wireless Fidelity (Wi-Fi), Wi-Fi Direct, Digital Living Network Alliance (DLNA), Wireless Broadband (WiBro), Worldwide Interoperability for Microwave Access (WiMAX), High Speed Downlink Packet Access (HSDPA), HSUPA (High Speed Uplink Packet Access), Long Term Evolution (LTE), LTE-A (Long Term Evolution-Advanced), and the like. The wireless Internet module 113 may transmit/receive data according to one or more of such wireless Internet technologies, and other Internet technologies as well.

In some embodiments, when the wireless Internet access is implemented according to, for example, WiBro, HSDPA, HSUPA, GSM, CDMA, WCDMA, LTE, LTE-A and the like, as part of a mobile communication network, the wireless Internet module 113 performs such wireless Internet access. As such, the Internet module 113 may cooperate with, or function as, the mobile communication module 112.

The short-range communication module 114 is configured to facilitate short-range communications. Suitable technologies for implementing such short-range communications include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, Wireless USB (Wireless Universal Serial Bus), and the like. The short-range communication module 114 in general supports wireless communications between the mobile terminal 100 and a wireless communication system, communications between the mobile terminal 100 and another mobile terminal 100, or communications between the mobile terminal and a network where another mobile terminal 100 (or an external server) is located, via wireless area networks. One example of the wireless area networks is a wireless personal area networks.

The location information module 115 is generally configured to detect, calculate, derive or otherwise identify a position of the mobile terminal. As an example, the location information module 115 includes a Global Position System (GPS) module, a Wi-Fi module, or both. If desired, the location information module 115 may alternatively or additionally function with any of the other modules of the wireless communication unit 110 to obtain data related to the position of the mobile terminal. As one example, when the mobile terminal uses a GPS module, a position of the mobile terminal may be acquired using a signal sent from a GPS satellite. As another example, when the mobile terminal uses the Wi-Fi module, a position of the mobile terminal can be acquired based on information related to a wireless access point (AP) which transmits or receives a wireless signal to or from the Wi-Fi module.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

Such cameras 121 may process image frames of still pictures or video obtained by image sensors in a video or image capture mode. The processed image frames can be displayed on the display unit 151 or stored in memory 170. In some cases, the cameras 121 may be arranged in a matrix configuration to permit a plurality of images having various angles or focal points to be input to the mobile terminal 100. As another example, the cameras 121 may be located in a stereoscopic arrangement to acquire left and right images for implementing a stereoscopic image.

The microphone 122 is generally implemented to permit audio input to the mobile terminal 100. The audio input can be processed in various manners according to a function being executed in the mobile terminal 100. If desired, the microphone 122 may include assorted noise removing algorithms to remove unwanted noise generated in the course of receiving the external audio.

The user input unit 123 is a component that permits input by a user. Such user input may enable the controller 180 to control operation of the mobile terminal 100. The user input unit 123 may include one or more of a mechanical input element (for example, a key, a button located on a front and/or rear surface or a side surface of the mobile terminal 100, a dome switch, a jog wheel, a jog switch, and the like), or a touch-sensitive input, among others. As one example, the touch-sensitive input may be a virtual key or a soft key, which is displayed on a touch screen through software processing, or a touch key which is located on the mobile terminal at a location that is other than the touch screen. On the other hand, the virtual key or the visual key may be displayed on the touch screen in various shapes, for example, graphic, text, icon, video, or a combination thereof.

The sensing unit 140 is typically implemented using one or more sensors configured to sense internal information of the mobile terminal, the surrounding environment of the mobile terminal, user information, and the like. For example, the sensing unit 140 may alternatively or additionally include other types of sensors or devices, such as a proximity sensor 141 and an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154. The display unit 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The audio output module 152 is generally configured to output audio data. Such audio data may be obtained from any of a number of different sources, such that the audio data may be received from the wireless communication unit 110 or may have been stored in the memory 170. The audio data may be output during modes such as a signal reception mode, a call mode, a record mode, a voice recognition mode, a broadcast reception mode, and the like. The audio output module 152 can provide audible output related to a particular function (e.g., a call signal reception sound, a message reception sound, etc.) performed by the mobile terminal 100. The audio output module 152 may also be implemented as a receiver, a speaker, a buzzer, or the like.

A haptic module 153 can be configured to generate various tactile effects that a user feels, perceive, or otherwise experience. A typical example of a tactile effect generated by the haptic module 153 is vibration. The strength, pattern and the like of the vibration generated by the haptic module 153 can be controlled by user selection or setting by the controller. For example, the haptic module 153 may output different vibrations in a combining manner or a sequential manner.

An optical output module 154 can output a signal for indicating an event generation using light of a light source. Examples of events generated in the mobile terminal 100 may include message reception, call signal reception, a missed call, an alarm, a schedule notice, an email reception, information reception through an application, and the like.

The interface unit 160 serves as an interface with various types of external devices that can be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control overall operation of the mobile terminal 100, in addition to the operations associated with the application programs. The controller 180 may provide or process information or functions appropriate for a user by processing signals, data, information and the like, which are input or output, or activating application programs stored in the memory 170.

To drive the application programs stored in the memory 170, the controller 180 may be implemented to control a predetermined number of the components mentioned above in reference with FIG. 1. Moreover, the controller 180 may be implemented to combinedly operate two or more of the components provided in the mobile terminal 100 to drive the application programs.

The power supply unit 190 can be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

Some or more of the components may be operated cooperatively to embody an operation, control or a control method of the mobile terminal in accordance with embodiments of the present disclosure. Also, the operation, control or control method of the mobile terminal may be realized on the mobile terminal by driving of one or more application problems stored in the memory 170.

Figure 2:
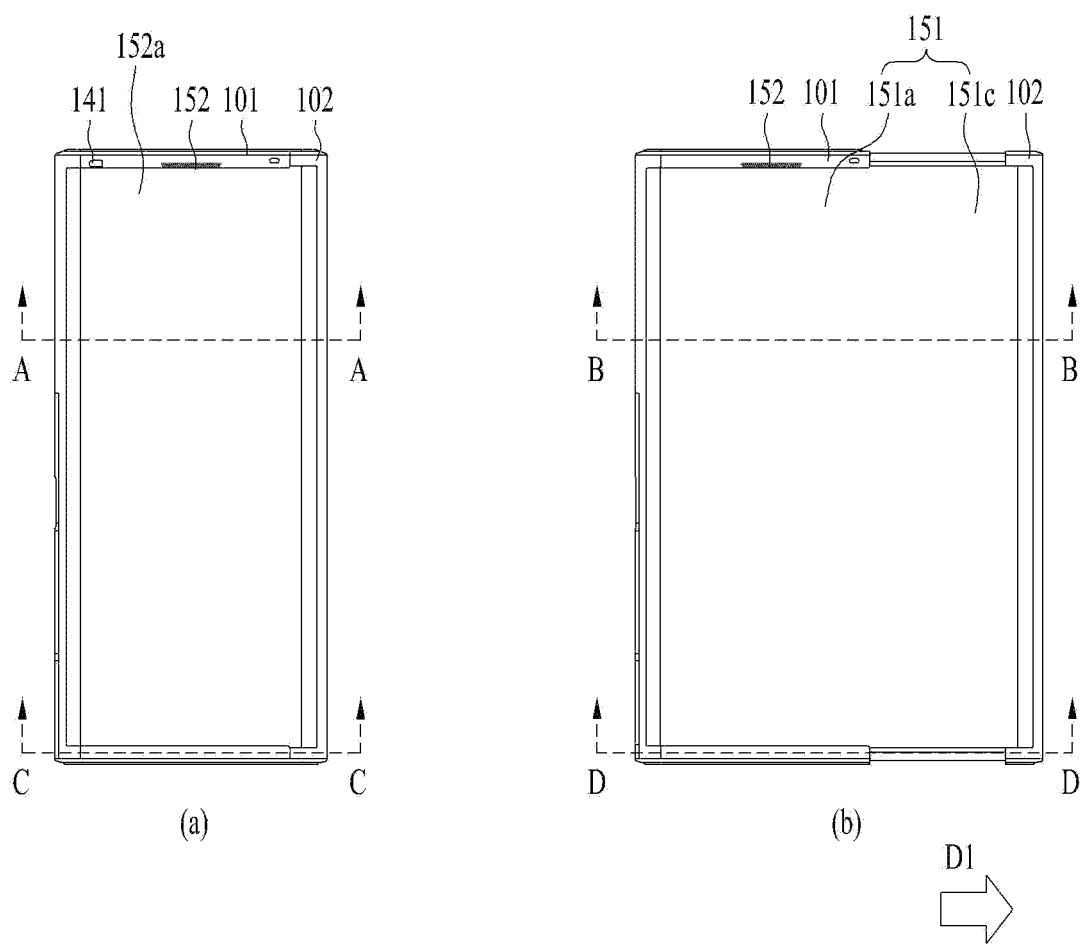
FIG. 2 is a front view of a first state and a second state of the mobile terminal in accordance with an embodiment.
Figure 3:
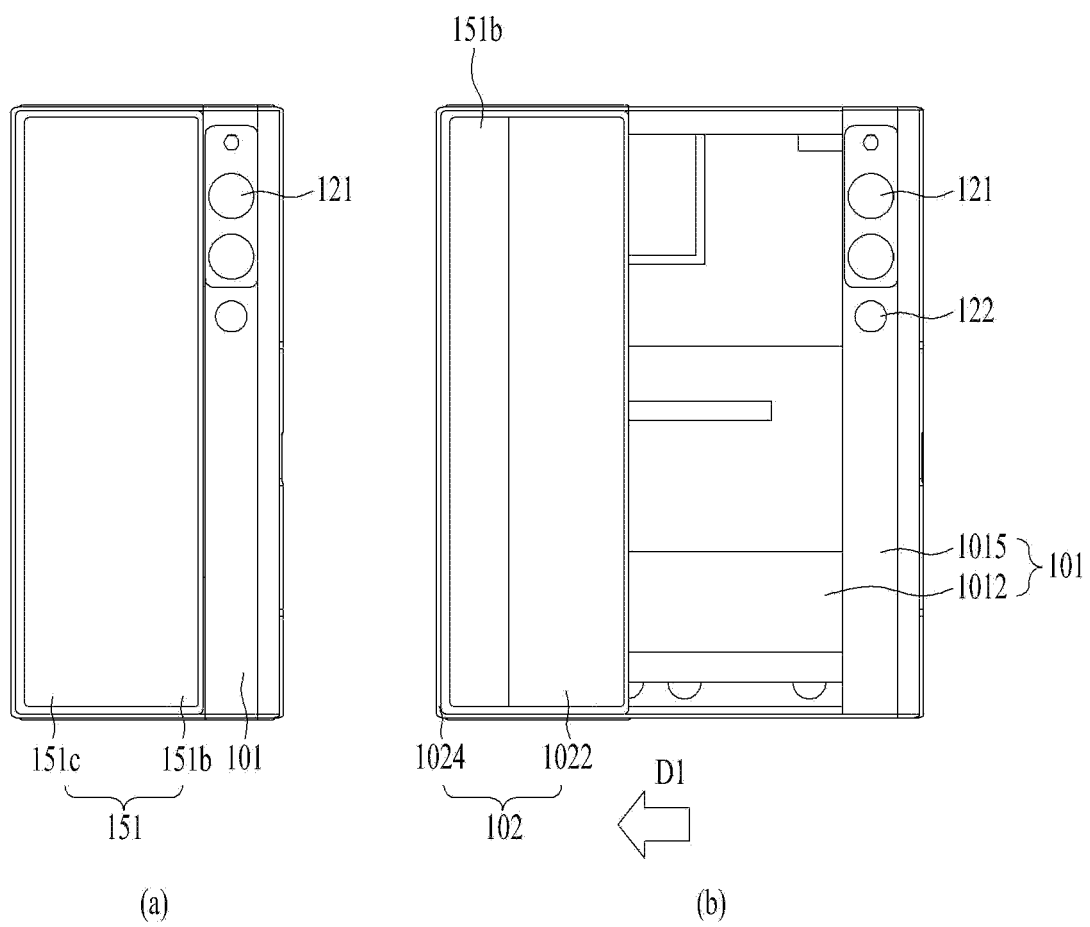
FIG. 3 is a rear view of the first state and the second state of the mobile terminal in accordance with an embodiment.

FIG. 2 is a front view of a first state and a second state of the mobile terminal in accordance with an embodiment, and FIG. 3 is a rear view of the first state and the second state of the mobile terminal in accordance with an embodiment. FIGS. 2(*a*) and 3(*a*) are views showing the first state in which the mobile terminal is contracted, and FIGS. 2(*b*) and 3(*b*) are views showing the second state in which the mobile terminal is extended.

As shown in the figures, the mobile terminal 100 in the first state is in a contracted position, and has a smaller size than the mobile terminal 100 in the second state. In addition, the size of the display unit 151 positioned on the front of the mobile terminal 100 is also smaller than in the second state. The mobile terminal 100 in the first state may be extended in a first direction D1 to switch to the second state. In the second state, as shown in FIG. 2(*b*), the size of the mobile terminal 100 and the size of the display unit 151 positioned on the front of the mobile terminal 100 are larger than in the first state, while the size of the display unit 151 positioned on the rear of the mobile terminal 100 is reduced as shown in FIG. 3(*b*). That is, a part of the display units 151 positioned on the rear of the mobile terminal 151 in the first state moves to the front of the mobile terminal 100 in the second state.

In the following description, the direction in which the mobile terminal 100 and the display unit 151 thereof are extended or enlarged is defined as a first direction D1, and the direction in which the mobile terminal contracts or retracts or is reduced to switch from the second state to the first state is defined as a second direction D2. A direction perpendicular to the first and second directions D1 and D2 is defined as a third and fourth directions. Description will be made on the assumption that the first and second directions are horizontal directions and the third and fourth directions are vertical directions. However, depending on the arrangement of the mobile terminal 100, the first and second directions may be vertical directions and the third direction may be a horizontal direction.

As such, a flexible display unit 151 which is bendable may be used as the display unit such that the position of the display unit may be varied. The flexible display unit 151 may be a display unit capable of maintaining a flat state like a conventional flat panel display and capable of warping, bending, folding, twisting, or rolling like paper. The flexible display unit 151 refers to a display which is manufactured on a thin and flexible substrate and is thus lightweight and robust as not to be easily broken. The flexible display unit according the present disclosure may be bent in a specific direction, and may be arranged such that the curvature thereof may change in the first direction.

In addition, an electronic paper is a display technology to which properties of general ink are applied. The electronic paper may be different from the conventional flat panel display in using reflected light. The electronic paper may change information using a twisted ball or electrophoresis using a capsule.

In a state in which the flexible display unit 151 is not deformed (e.g., a state of having an infinite curvature radius, hereinafter referred to as a basic state), a display region of the flexible display unit 151 becomes flat. In a state in which the flexible display unit 151 is deformed by an external force from the basic state (e.g., a state of having a finite radius of curvature, hereinafter referred to as a deformed state), the display region may become a curved face. As shown, information displayed in the deformation state may be visual information output on the curved face. Such visual information is implemented by independently controlling light emission of sub-pixels arranged in a matrix. The sub-pixel refers to a minimum unit for implementing one color. When external force is applied to the flexible display unit 151, the flexible display unit 151 may be deformed to switch from the default state, which is the flat state, to a bent state, which is not the flat state.

The flexible display unit 151 may be combined with a touch sensor to implement a flexible touch screen. When a touch is made on the flexible touch screen, the controller 180 (see FIG. 1) may perform control corresponding to such touch input. The flexible touch screen may be configured to detect the touch input in the deformed state as well as in the basic state.

The touch sensor detects the touch (or touch input) applied on the touch screen using at least one of various touch schemes such as a resistive film scheme, a capacitance scheme, an infrared scheme, an ultrasonic wave scheme, a magnetic field scheme, and the like.

As an example, the touch sensor may be configured to convert a change in pressure applied on a specific portion of the touch screen, capacitance generated at the specific portion, or the like into an electrical input signal. The touch sensor may be configured such that a touch object applying a touch on the touch screen may detect touched position and area on the touch sensor, a pressure during the touch, a capacitance during the touch, and the like.

Further, the mobile terminal 100 may have a deformation detection means for detecting the deformation of the flexible display unit 151. Such deformation detection means may be included in the sensing unit 140 (see FIG. 1).

The deformation detection means may be disposed in the flexible display unit 151 or a case (first to second frames 101 to 102 to be described later) to detect information related to the deformation of the flexible display unit 151. In this connection, the information related to the deformation may include a direction in which the flexible display unit 151 is deformed, a degree of the deformation, a deformed position, a deformed time, an acceleration at which the deformed flexible display unit 151 is restored, and the like. In addition, the information related to the deformation may include various kinds of information that may be detected due to the bending of the flexible display unit 151.

In addition, the controller 180 may change information displayed on the flexible display unit 151 or generate a control signal for controlling a function of the mobile terminal 100 based on the information related to the deformation of the flexible display unit 151 detected by the deformation detection means.

The deformation of the flexible display unit 151 may vary depending on the positions of the first frame 101 and the second frame 102. As shown in FIG. 2, since the bending position on the flexible display unit 151 is determined according to the positions of the first frame and the second frame, the bending deformation position of the flexible display unit 151 and the area thereof positioned on the front may be calculated based on the positions of the first frame 101 and the first frame 102 in place of the deformation detection means of the flexible display unit 151.

The state conversion (first or second state) of the flexible display unit 151, i.e., the size change at the front and rear faces of the mobile terminal 100 of the display unit 151 based on the size change of the mobile terminal 100 may be performed manually by a force applied by the user, but may be not limited to such manual scheme. For example, when the mobile terminal 100 or the flexible display unit 151 is in the first state, the mobile terminal 100 or the flexible display unit 151 may be converted into the second state by the user or an application command without the external force applied by the user. As such, in order for the flexible display unit 151 to be automatically deformed without the external force, the mobile terminal 100 may include a driving unit 200, which will be described later.

The flexible display unit 151 of the present disclosure is bent 180 degrees by rolling around a side portion of the mobile terminal 100 facing in the first direction. Accordingly, based on the side portion of the mobile terminal 100, a part of the flexible display unit 151 is disposed on the front of the mobile terminal 100, and the other part of the flexible display unit 151 is disposed on the rear of the mobile terminal 100. For simplicity, the part of the flexible display unit 151 positioned on the front is called a front face, and the other part of the flexible display unit 151 positioned on the rear is called a rear face. As illustrated in FIG. 2, the mobile terminal may extend in the first direction or contract in the second direction opposite to the first direction. In this case, the area of the flexible display unit 151 positioned on the front changes. That is, the sizes of the front face and the rear face may be changed according to a change in the state of the mobile terminal.

The part of the flexible display unit 151 positioned on the front of the mobile terminal 100 may be immovably fixed to the front surface of the first frame 101, and the other part thereof positioned on the rear of the mobile terminal 100 may be movably arranged on the rear of the mobile terminal 100.

In addition, the flexible display unit 151 may be rolled on or released at the side portion in the first direction of mobile terminal. Accordingly, the rear face of the display unit 151 moves, so that the size of the front face of the display unit 151 may be adjusted. Since the size of the flexible display unit 151 is determined and the flexible display unit 151 is formed of one continuous body, an area of rear face of the display unit 151 decreases as an area of the front face of the display unit 151 increases. Such a display unit 151 may be rolled in a second frame 102, which is movable relative to a first frame 101 to be described later, more correctly, on one of sides of the second frame 102. The display unit 151 may be withdrawn or pulled out from or inserted or pushed into the second frame 102 while being rolled in the second frame 102 along a moving direction of the second frame 102 to adjust the area of the display unit 151 on the front face of the mobile terminal 100. Such operation will be described in more detail below along with other relevant components of the mobile terminal 100.

Typically, an antenna is disposed in the case or the housing of the mobile terminal 100, but a portion where the antenna is installed in the case or the housing may be limited because of the flexible display unit 151 that covers not only the front face of the mobile terminal 100 but also the rear face thereof. For this reason, the antenna may be implemented on the flexible display unit 151. An antenna on display (AOD) is an antenna in which a transparent film is formed by stacking an electrode layer and a dielectric layer that have patterns engraved thereon, respectively. The antenna on display may be implemented thinner than an antenna implemented using a laser direct structuring (LDS) technology using a conventional copper nickel plating scheme, so that the antenna on display may not be exposed to the outside without affecting a thickness. In addition, the antenna on display may transmit and receive a signal directly to or from the display unit 151. Accordingly, the antenna on display may be used in the mobile terminal 100 in which the display unit 151 is located on the both faces of the mobile terminal 100 as in the present disclosure.

Figure 4:
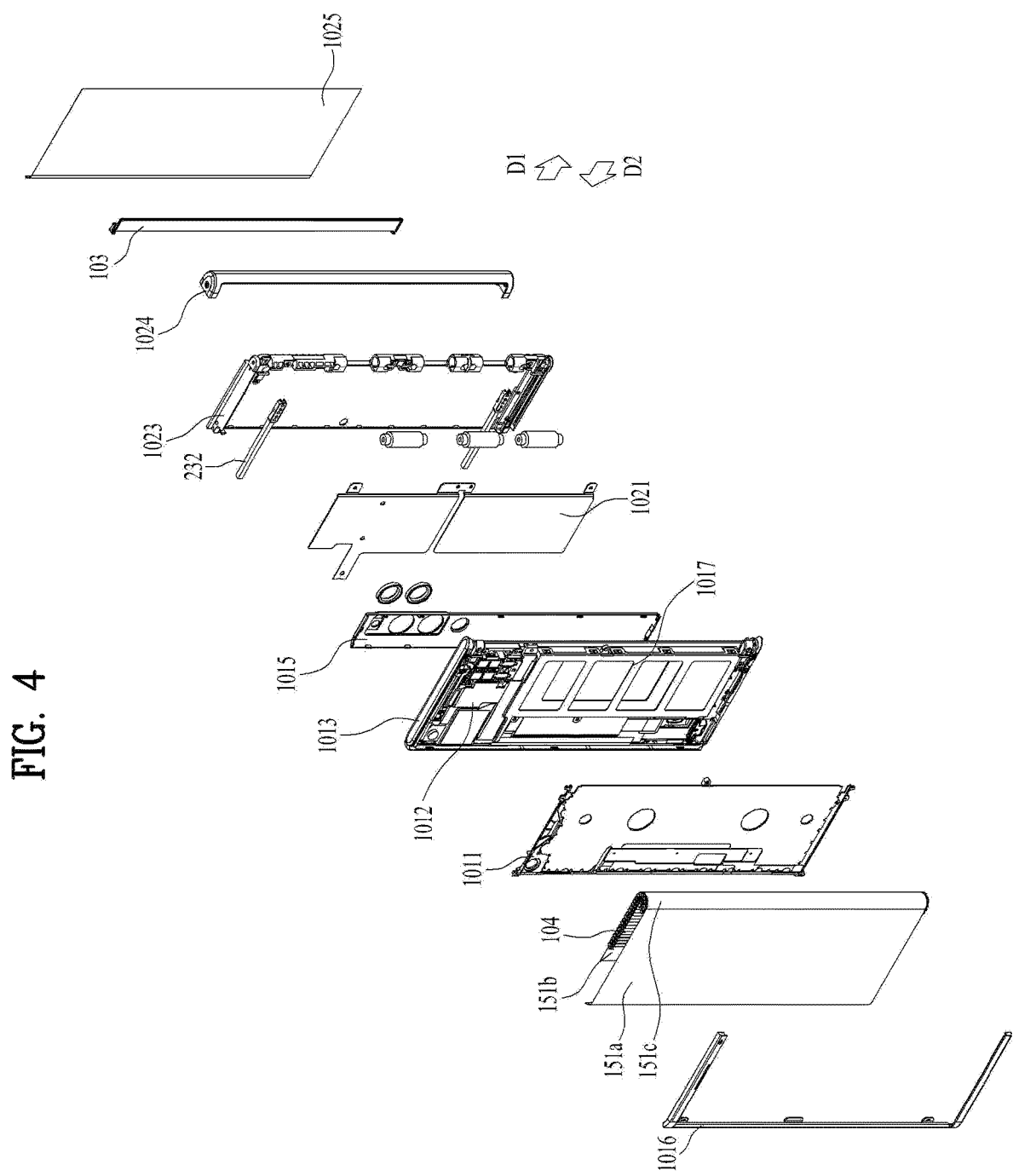
FIGS. 4 and 5 are exploded perspective views of the mobile terminal in accordance with an embodiment.
Figure 5:
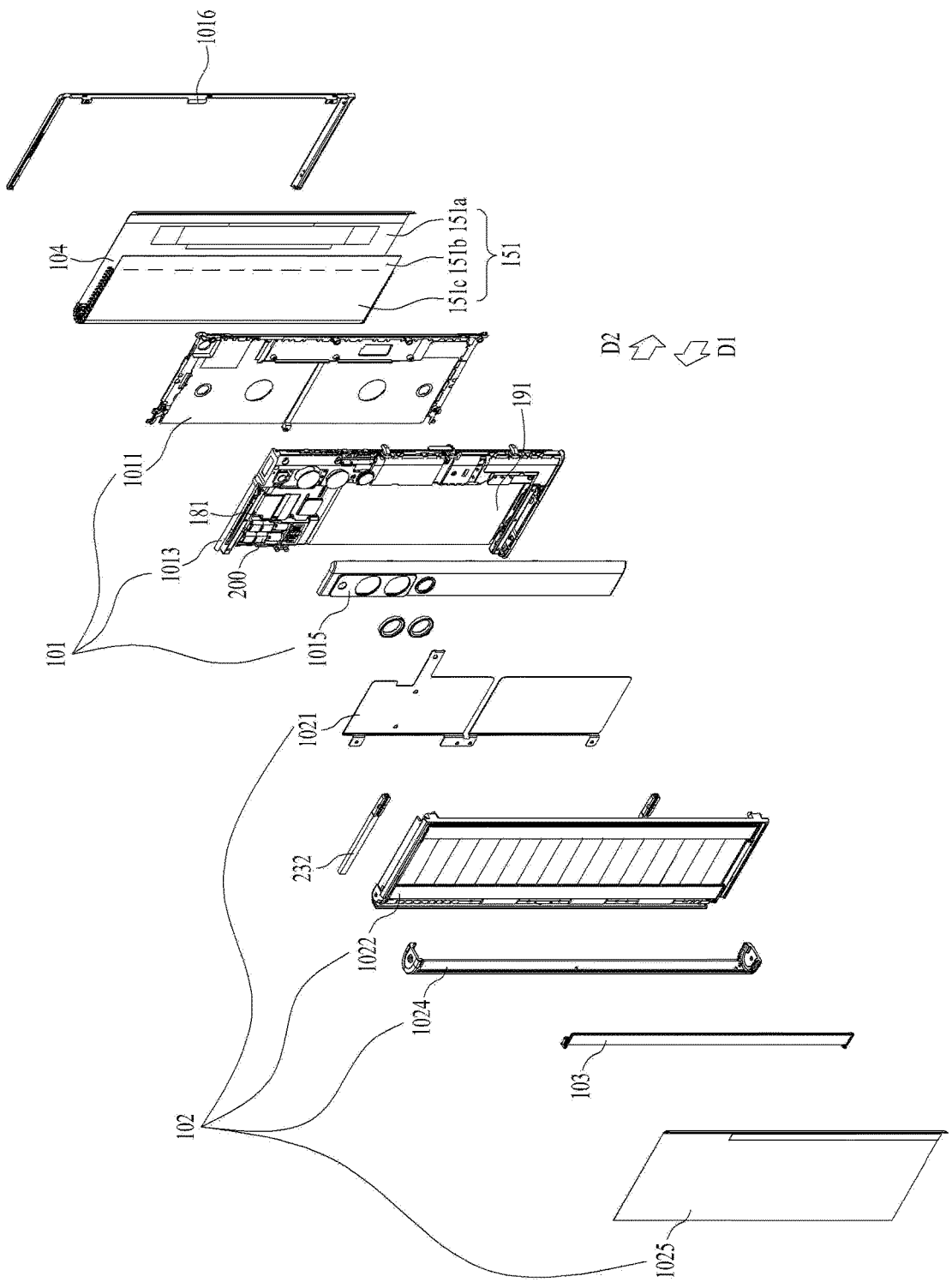

FIGS. 4 and 5 are exploded perspective views of the mobile terminal in accordance with an embodiment. FIG. 4 is an exploded perspective view of the mobile terminal as viewed from the front side, and FIG. 5 is an exploded perspective view of the mobile terminal as viewed from the rear side.

The mobile terminal 100 of the present disclosure includes frames 101 and 102 in which components are mounted, and the frames 101 and 102 of the present disclosure may vary in size in the first direction as shown in FIG. 2. One or more frames 101 and 102 move relative to each other, and sizes thereof may vary in the first direction. Electronic components are mounted in the frames 101 and 102, and the flexible display unit 151 is located out of the frames 101 and 102.

Since the mobile terminal 100 of the present disclosure includes the flexible display unit 151, the flexible display unit 151 may be combined in a form surrounding front faces and rear faces of the frames 101 and 102. The frame may include the first frame 101 and the second frame 102 moving in the first direction with respect to the first frame 101. The first frame 101 and the second frame 102 include front portions, a rear portions, and side portions, respectively, and are coupled to each other.

First, the first frame 101 corresponds to a main body of the mobile terminal 100, and may have a space between the first front portion 1011 and the first rear portion 1012 therein for accommodating various components. In addition, the first frame 101 may accommodate the second frame 102 movably coupled to the first frame 101 in such a space. More specifically, as shown in FIGS. 2 and 5, the first frame 101 may include a first front portion 1011 disposed at a front portion of the mobile terminal 100 and supporting the front face of the display unit 151 and a first rear portion 1012 disposed at a rear portion of the mobile terminal and on which various components are mounted. A front deco 1016 may cover front edges of the first area 151a to protect the edges of the first area 151a.

The first front portion 1011 and the first rear portion 1012 may be spaced apart from each other at a predetermined spacing to define a predetermined space therebetween, and may be connected to each other by a first side portion 1013. The first side portion 1013 may be integrally formed with the first rear portion 1012 or the first front portion 1011. The camera 121, the audio output module 152, and the input/output terminal, the controller 180, and the power supply unit 190 may be accommodated as components of the mobile terminal 100 in the space in the first frame 101. For example, the controller 180 may be a circuit board 181 including a processor and an electronic circuit for controlling the operation of the mobile terminal, and the power supply unit 190 may be a battery 191 and related components. In addition, the driving unit 200 that controls the slide movement of the second frame 102, which will be described later, may also be accommodated in the first frame 101.

As described above, the display unit 151 has the continuous body, and thus, may be disposed on both the front face and the rear face of the mobile terminal 100 while being rolled in the mobile terminal 100. The display unit 151 may include the front face positioned at the front face of the mobile terminal 100, the rear face positioned at the rear face of the mobile terminal 100, and the side face positioned between the front face and the rear face thereof and surrounding the side face of the mobile terminal. The front face and the rear face of the display unit 151 are flat, and the side face of the display unit 151 may form a curved face. The flexible display unit 151 may be damaged when being bent at an angle. Thus, the flexible display unit 151 may be formed to be bent with a predetermined curvature at the side face.

The display unit 151 may be divided into a fixed portion 151a and 151b and a variable portion 151c. The fixed portion 151a and 151b means a portion fixed to the frame. Because of being fixed to the frame, the fixed portion 151a and 151b maintains a constant shape without changing a bending degree. On the other hand, the variable portion 151c means a portion in which a bending angle or a position of the bent portion changes. The variable portion 151c in which the position or bending angle of the bent portion changes requires a structure for supporting a rear face of the variable portion 151c in response to the change.

The fixed portion 151a, 151b is coupled to the first frame of the display unit and is always positioned on the front face of the display unit to form a portion of the front face of the display unit. The variable portion 151c includes a side face located at a side portion of the mobile terminal, and a position of the side face varies depending on the position of the second frame. Based on a side face, an area of a portion disposed on the front face of the display unit and an area of a portion disposed on the rear face of the display unit vary. That is, a portion of the variable portion 151c may be the front face and another portion of the variable portion 151c may be the rear face based on the first and second states. The variable portion 151c is positioned in the first direction with respect to the fixed portion 151a, 151b relative to the mobile terminal, and an end of the variable portion 151c is bent toward the rear face of the mobile terminal and slides on the rear face of the second frame.

The end of the variable portion of the display unit is coupled with a slide frame that guides the variable portion to slide move on the rear face of the second frame, and the slide frame moves in the first direction at the same time as the second frame moves in the first direction. As a result, a moving distance of the slide frame with respect to the first frame is twice as a moving distance of the second frame with respect to the first frame. Further, as shown in FIG. 3, the first rear portion 1012 of the mobile terminal 100 includes an exposed rear portion 1015 that is exposed to the outside without being covered by the display unit 151 even in the first state. The physical input unit 120 for the manipulation of the mobile terminal 100 such as various buttons, switches, the camera 121, and a flash, and the sensing unit 140 such as the proximity sensor 141 or a fingerprint sensor may be arranged on the exposed rear portion 1015. The first rear portion 1012 except for the exposed rear portion 1015 may be covered by the display unit 151 in the first state as shown in FIG. 3(a), and may be exposed rearward in the second state as shown in FIG. 3(b).

In a conventional bar-shaped terminal, a display unit is provided only on a front face of the terminal. Therefore, a main camera is placed on a rear face of the terminal in order for the user to capture an object at an opposite side while looking through the display unit. On the other hand, an additional auxiliary camera is required to be disposed on the front face of the terminal in order for the user to capture himself or herself while viewing himself or herself through the display unit.

In the mobile terminal 100 of the present disclosure, on the other hand, the display unit 151 is arranged on both the front and rear of the mobile terminal 100. Accordingly, when a user photographs himself, a portion of the display unit 151 positioned on the same surface as the camera 121, that is, the rear face of the display unit 151 may be used. When the user takes a photograph of an object around the user, a portion of the display unit 151 on the side facing away from the camera 121, that is, the front face of the display unit 151 may be used. For this reason, the mobile terminal 100 may take a photograph of the user or an object located around the user using one camera 121. The camera may include a plurality of cameras having different angles of view, such as wide angle, ultra wide angle, and telephoto angle. Not only the camera but also a proximity sensor and an audio output unit may be disposed on the exposed rear portion 1015, and an antenna may be installed on the rear portion 1015. The rear portion 1015 may be used to protect the camera, the sensor, or the like on the exposed rear portion 1015 and not to deteriorate the exterior design. A portion of the rear portion 1015 corresponding to the camera 121 or the sensor 140 may be configured to be transparent, and the other portion thereof may have a predetermined pattern or color in consideration of design aspects without exposing internal parts.

The first side portion 1013 may extend along the edges of the first front portion 1011 and the first rear portion 1012 to surround the circumference of the first frame 101 and may define the appearance of the mobile terminal 100. However, as mentioned above, the second frame 102 is accommodated in and movably coupled to the first frame 101, and therefore a portion of the first frame 101 needs to be open to allow movement of the second frame 102 relative to the first frame 101. As an example, as best shown in FIG. 2, the second frame 102 may be movably coupled to a side of the first frame 101 facing in the first direction, and accordingly the first side portion 1013 may not be formed on the lateral surface facing in the first direction such that the lateral surface is open. Since the first side portion 1013 is exposed to the outside of the mobile terminal 100, the interface unit 160 for connecting a power port or an ear jack or the user input unit 120, such as a volume control button, may be disposed on the first side portion 1013. When the first side portion 1013 contains a metal material, the first side portion 1013 may serve as an antenna.

The second frame 102 may include a second front portion 1021 disposed at the front portion of the mobile terminal 100 and a second rear portion 1022 disposed at the rear portion of the mobile terminal 100. Like the first front portion 1011 and the first rear portion 1012 of the first frame 101, the second front portion 1021 and the second rear portion 1022 may be formed of plate-shaped members that are generally flat. In addition, the second frame 102 also accommodates various components, and must not interfere with the components accommodated in the first frame 101 during the movement. Accordingly, the second front portion 1021 and the second rear portion 1022 may be coupled to each other in a state of being spaced apart from each other to define a predetermined space therebetween, and may have shapes that do not interfere with the components in the first frame 101.

FIG. 6 is a side view of the mobile terminal as viewed from a third direction. FIG. 6 shows the first side portion 1013 of the first frame 101 and a second side portion 1023 of the second frame 102. Since the flexible display unit 151 is positioned at an end of the second frame 102 facing in the first direction, the end of the second frame 102 facing in the first direction should not be exposed to the outside. An end of the second frame 102 facing in the second direction should be open so as not to interfere with the first frame 101. In the first state, the second side portion 1023 of the second frame 102, which is positioned on the side facing in the third direction (which refers to the upward or downward direction in the drawing or may include both the upward and downward directions), may not be exposed to the outside because it overlaps the first side portion 1013 of the first frame. However, in the second state, it may be exposed to the outside because the second frame 102 is drawn out.

In addition, the display unit 151 may be bent 180 degrees while being rolled in the second frame 102 to be disposed on both the front face and the rear face of the mobile terminal 100. For such an arrangement of the display unit 151, the second frame 102 may include a roller 210 rotatably disposed therein. The roller 210 may be disposed at any position inside the second frame 102. However, the display unit 151 should be spread flat on the front face and the rear face of the mobile terminal 100 to provide a good quality screen to the user. Further, for such spread, a proper tension must be provided on the display unit 151. In order to provide the proper tension, the roller 210 may be disposed at a first directional end of the second frame 102. The roller 210 may extend in the third direction, and may be rotatably coupled to the second frame 102.

The display unit 151 may be rolled around the roller 210 while being gently bent with a predetermined curvature. The flexible display unit 151 may include a first face on which a video is output and exposed to the outside and an inner face facing the frame at the opposite side. The roller 210 may be installed to rotate freely in the second frame 102 while being in contact with the inner face of the display unit 151. Accordingly, the roller 210 may actually move the display unit 151 in a lateral direction of the mobile terminal 100, that is, in a direction perpendicular to a longitudinal direction. As will be described later, when the second frame 102 slides, because of the tension applied by the second frame 102, the display unit 151 moves to the front face or the rear face of the mobile terminal 100 in different directions (i.e., the first direction D1 or the second direction D2) relative to the second frame 102. The roller 210 may guide such movement while rotating.

The roller 210 may be disposed adjacent to the end of the second frame 102 that faces in the first direction. A side frame 1024 may be disposed at the end of the second frame 102 facing in the first direction to prevent damage to the display unit 151 rolled around the roller 210.

The side frame 1024 may extend in the longitudinal direction (the third direction) of the second frame 102 to cover the side portion facing in the first direction, thereby protecting the roller 210 and the display unit 151 rolled therearound.

The side frame 1024 may substantially define the appearance of the mobile terminal 100 in cooperation with the first side portion 1013 of the first frame 101. In addition, the side portion of the second frame 102 that faces in the second direction may be omitted to minimize interference with the components arranged in the first frame 101 during movement.

During the expansion and the contraction in such first and second directions D1 and D2, the second frame 102 may overlap the first frame 101, more precisely, the first front portion 1011 and the first rear portion 1012 thereof so as not to interfere with the first frame 101. More specifically, the display unit 151 may be coupled to and supported by the first front portion 1011 of the first frame 101, as described above. Accordingly, the display unit 151 does not need to be additionally supported by the second front portion 1021 of the second frame 102. Rather, when the second front portion 1021 is interposed between the first front portion 1011 and the display unit 151, the display unit 151 may be deformed or damaged because of friction with the second front portion 1021, which is repeatedly moved. Thus, the second front portion 1021 may be disposed below the first front portion 1011, or may be interposed between two first front portions 1011. The second rear portion 1022 of the second frame 102 may be disposed rearward of the first rear portion 1012 of the first frame 101. That is, the front face of the second rear portion 1022 may face the rear face of the first rear portion 1012. In addition, the rear face of the first rear portion 1012 may be in contact with the front face of the second rear portion 1022 to stably support the movement of the second frame 102. Because of such arrangement, the second rear portion 1022 may be exposed to the outside of the first frame, more precisely, of the first rear portion 1012, and may be coupled to the display unit 151.

In addition, the second frame 102 may extend and contract in the first and second directions D1 and D2 to change the size of the mobile terminal 100, particularly, to extend or contract the front face of the mobile terminal 100. Thus, the display unit 151 must move by such extended or reduced front face size to obtain the intended first and second states. However, when being fixed to the second frame 102, the display unit 151 may not be moved smoothly to be adapted for the front face of the mobile terminal 100 that is extended or contracted. For this reason, the display unit 151 may be movably coupled to the second frame 102.

More specifically, the display unit 151 may include a first region 151a disposed on the front of the mobile terminal 100, a second region 151b coupled to a slide frame 103 positioned on the rear of the mobile terminal 100, and a third region 151c located between the first region 151a and the second region 151b and bent around the roller 210. The third region 151c may move to the front or the rear according to change in the state of the mobile terminal 100. The slide frame 103 may be formed of a plate-shaped member extending in the longitudinal direction (the third direction) of the mobile terminal 100, and may be coupled to the second rear portion 1022 so as to be movable in the first and second directions D1 and D2.

The first to third regions 151a, 151b, and 151c may be connected to each other, and may form a continuous body of the display unit 151. In addition, as described above, for the movement of the third region 151c toward the front face or the rear face of the mobile terminal 100 depending on the moving direction of the second frame 102, the first region 151a may be fixed so as not to move to the front face of the mobile terminal 100, and the second region 151b may be provided to be movable on the rear face of the mobile terminal. Such configuration of the display unit 151 will be described in more detail below.

The first region 151a may be disposed on the front face of the mobile terminal 100, more specifically, the first frame 101, that is, on the front face of the first front portion 1011. The first region 151a is fixed to the first frame 101, that is, the front face of the first front portion 1011 so as not to be moved during the movement of the second frame 102, and thus, the first region 151a may always be exposed to the front face of the mobile terminal 100.

The third region 151c may be disposed to adjoin a first direction of the first region 151a and extended in a rear direction by being rolled on the roller 210. The third region 151c arranged in the rear direction may cover the second frame 102, that is, the rear surface of the second rear portion 1022. Meanwhile, since the second frame 102, that is, the second rear portion 1022 is adjacent to the first frame 101, that is, the first rear portion 1012 and forms the rear case of the mobile terminal together with the first rear portion 1012, it may be considered that the third region 151c is disposed on the rear surface of the first frame 101.

The second region 151b may be adjacent to the third region 151c and may be disposed on the rear face of the mobile terminal 100, more specifically, on the second frame 102, that is, the rear face of the second rear portion 1022 thereof. The second region 151b may be coupled to the slide frame 103 without being directly coupled to the second frame 102.

As a result, the first region 151a may be disposed on the front face of the mobile terminal 100 and may be always exposed to the front face regardless of the movement of the second frame 102, and the second region 151b may be disposed on the rear face of the mobile terminal 100 and may be always exposed to the rear face regardless of the movement of the second frame 102. In addition, the third region 151c may be disposed between the first and second regions 151a and 151b, and may be selectively placed on the front face or the rear face of the mobile terminal 100 depending on the moving directions D1 and D2 of the second frame 102.

Because of such selective placement of the third region 151c, the first rear portion 1012 of the first frame 101 may be exposed to the outside of the mobile terminal 100 because the first rear portion 1012 is covered by the second and third regions 151b and 151c and the second rear portion 1022 of the display unit 151 in the first state, but, in the second state, the third region 151c moves to the front face of the mobile terminal 100 and the second rear portion 1022 also moves in the first direction D1. In addition, the second front portion 1021 of the second frame 102 is hidden by the first front portion 1011 of the first frame 101 in the first state, but, in the second state, moves out of the first frame 101 to support the third region 151c of the display unit 151 disposed on the front face of the mobile terminal 100.

In order to prevent the second front portion 1021 from affecting the internal components during the slide movement, a separating plate 1017 may be further disposed rearward of the second front portion 1021 and fastened with the first front portion 1011. The second front portion 1021 may move between the first front portion 1011 and the separating plate 1017 based on the slide movement of the second frame.

However, the third region 151c may be rolled on the roller 210 and bent in the second frame 102. When converting from the first state to the second state, the third region 151c may extend from the second frame 102 to the front face of the mobile terminal 100 while being rolled on the roller 210 in one direction. On the other hand, when converting from the second state to the first state, the third region 151c may be retracted from the front face of the mobile terminal 100 to the second frame 102 while being rolled on the roller 210 in the opposite direction, and at the same time, may return to the rear face of the mobile terminal 100 from the second frame 102.

A specific location of the foldable mobile terminal in a form of being spread like a book is easily damaged because only the specific location is folded repeatedly. On the other hand, the deformed portion of the flexible display unit 151, that is, a portion rolled on the roller 210, may vary based on the first and second states of the mobile terminal 100, that is, the movement of the second frame 102. Accordingly, the mobile terminal 100 of the present disclosure may significantly reduce deformation and fatigue repeatedly applied to a specific portion of the display unit 151, thereby preventing damage to the display unit 151.

Based on the above-described configuration, overall operations of the mobile terminal 100 will be described as follows. As an example, the state conversion may be performed manually by the user, and an operation of the mobile terminal 100 during such manual state conversion will be described. However, operations of the first frame 101, second frame 102, and slide frames 103 and the display unit 151, which will be described below, may be performed in the same manner when a power source other than a user's force is used, for example, when the driving unit 200 to be described below is applied.

A rear face cover 1025 may be further disposed on a rear face of the second rear portion 1022 such that the rear face of the display unit positioned on the rear face of the mobile terminal 100 is not exposed to the outside. The rear face of the display unit may be used in the first state when the rear face cover 1025 uses a transparent material, and the rear face of the display unit may be covered such that the movement of the slide frame 103 is not exposed when the rear face cover 1025 uses an opaque material. That is, the second region and the third region of the slide frame 103 and the display unit 151 may move in the first direction and in the second direction in a space between the second rear portion 1022 and the rear face cover 1025.

FIG. 7 is a view showing a driving unit 200 of the mobile terminal 100 in accordance with an embodiment. FIG. 7(a) shows the first state and FIG. 7(b) shows the second state. The mobile terminal 100 of the present disclosure may be switched between the states in a manner in which a user manually pulls the second frame 102 in the first direction D1 or pushes the same in the second direction D2 with respect to the first frame 101. However, in the manual method, applying excessive force to the body of the mobile terminal 100 may damage the mobile terminal 100. Accordingly, a driving unit 200 employing a motor 201 may be further provided to cause the second frame 102 to stably move without distortion.

As the motor 201, a motor 201 configured to provide rotational force as shown in FIG. 7, or a linear motor 201 configured to make linear motion may be used. The motor 201 configured to provide the rotational force should have a large diameter to provide large force. Two motors 201 may be used as shown in FIG. 7 to provide driving force of a predetermined magnitude or more in the limited space of the mobile terminal 100 without increasing the thickness.

If the second frame 102 is moved excessively fast, damage or malfunction may occur. Accordingly, a planetary gear configured to decrease the speed of the motor 201 to ensure movement at a stable speed may be further provided. The planetary gear 202 serves to amplify or attenuate the number of revolutions of the motor 201 using a plurality of disc gears having different numbers of teeth. The motor 201 may be fixed to the first frame 101 as shown in FIG. 7(a). The position of the motor 201 is fixed even when the second frame 102 moves in the first direction to switch the mobile terminal 100 to the second state, as shown in FIG. 7(b).

Since the second frame 102 linearly moves with respect to the first frame 101 in the first direction or the second direction, rack and pinion gears configured to convert the rotational force of the motor 201 into linear motion may be used. A pinion gear to receive the rotational force of the motor 201 may be arranged to engage with a gear rack 205 composed of teeth continuously arranged in the first direction. The pinion gear may be fixed to the first frame 101 together with the motor 201 and the gear rack 205 may be positioned on the second frame 102. Alternatively, the gear rack 205 may be positioned on the first frame 101, and the motor 201 and the pinion gear may be arranged on the second frame 102. Since the motor 201 holds the pinion gear such that the pinion gear does not rotate, the second frame 102 may maintain the first state and the second state. However, when large external force is applied, the second frame 102 may be displaced as the pinion gear rotates.

A stopper (not shown) configured to fix the positions of the second frame 102 or the gear rack 205 and the first frame 101 may be further provided to fix the mobile terminal 100 in the first state or the second state. When electric current flows through the motor 201 to drive the motor 201, the stopper may be released to allow the movement of the second frame 102. When power is not applied to the motor 201 and thus the motor 201 does not rotate, the first frame 101 and the second frame 102 may be fastened such that the positions thereof are fixed.

When a pair of driving units 200 is symmetrically disposed in the vertical direction (the third direction), stable movement may be made. However, to arrange a battery or the like, the driving unit 200 should be arranged biased to one side in consideration of the limited mounting space of the mobile terminal 100 as shown in FIG. 7(a). According to such asymmetric arrangement of the driving unit 200, the second frame 102 may be distorted during movement due to a difference in movement speed between the upper end portion and the lower end portion. To address this issue, a linear guide 230 may be further provided.

The linear guide 230 may be disposed at both ends of the mobile terminal 100 facing in the third direction, that is, on the upper and lower sides of the mobile terminal 100, in order to supplement the function of one driving unit 200 biased to one side in the third direction. The linear guide 230 may include a guide rail 231 extending in the first direction and a guide block 232 configured to move along the guide rail 231. The guide rail 231 may be disposed on the first frame 101 and the guide block 232 may be disposed on the second frame 102, or vice versa. In this embodiment, the guide rail 231 may be disposed on the second frame 102 to cover the upper and lower sides of the extended portion of the second frame 102 in the second state.

After the guide block 232 is coupled to the first frame 101 and the guide rail 231 is coupled to the second frame 102, the guide block 232 and the guide rail 231 may be slidably fastened to each other. However, for convenience of the fastening, the guide block 232 and the guide rail 231 fastened to each other. Then, the guide block 232 may be first fixed to the first frame 101, and then the second frame 102 may be coupled to the guide rail 231.

The guide block 232 may be provided with a guide groove into which the guide rail 231 is inserted. Alternatively, the guide rail 231 may be provided with a rail groove into which a portion of the guide block 232 is inserted. The fastening portions of the guide rail 231 and the guide block 232 may be formed to be bumpy. Accordingly, movement in the first direction or the second direction may be made without displacement in the thickness direction of the mobile terminal 100. In order to reduce friction between the guide block 232 and the guide rail 231, a self-lubricating member having high wear resistance and low friction resistance, such as a bearing or polyoxymethylene (POM), may be added to the inside of the guide groove.

FIG. 8 is a cross-sectional view taken along lines A-A and B-B in FIG. 2. As illustrated in FIG. 2, when the second frame 102 switches to the second state by moving in the first direction, the third region 151c positioned on the rear side moves to the front, and thus a structure to support the rear surface of the third region 151c moved to the front is required. The second front portion 1021 positioned on the front surface of the second frame 102 may be positioned on the rear surface of the third region 151c in the second state. However, in the first state, the second front portion 1021 is disposed to overlap the first front portion 1011 of the first frame 101, and accordingly the first front portion 1011 and the second front portion 1021 form a step. A boundary is formed between the first region 151a and the third region 151c of the flexible display unit 151 by the step formed by the first front portion 1011 and the second front portion 1021. A rolling plate 104 may be used as a support structure to fill the gap between the second front portion 1021 and the third region 151c of the flexible display unit 151.

The rolling plate 104 may be positioned on the rear surface of the flexible display unit 151, and have a thickness corresponding to the gap between the second front portion 1021 and the flexible display unit 151 in the second state. As shown in FIG. 8(a), in the first state, the rolling plate 104 is rolled around the roller 210 and is positioned on the lateral side and rear side of the mobile terminal 100. The flexible display unit 151 and the rolling plate 104 may be positioned between the second rear portion of the second frame 102 and a rear cover 1025 provided to cover the rear face of the display unit 151. As shown in FIG. 8(b), when switch to the second state occurs, the rolling plate 104 may move to the front and the rolling plate 104 may be positioned on the front portion of the second frame 102.

The third region 151c of the display unit 151 in which the rolling plate 104 is positioned is a portion where bending deformation occurs when switch from the first state to the second state occurs. Accordingly, the rolling plate 104 may be deformed according to deformation of the third region 151c. Here, the rolling plate 104 is required to have a predetermined stiffness to maintain the flat state when the flexible display unit 151 is positioned on the front or rear of the mobile terminal. That is, the rolling plate 104 needs a structure capable of maintaining the flat state in the third direction and performing bending deformation in the first direction.

Figure 9:
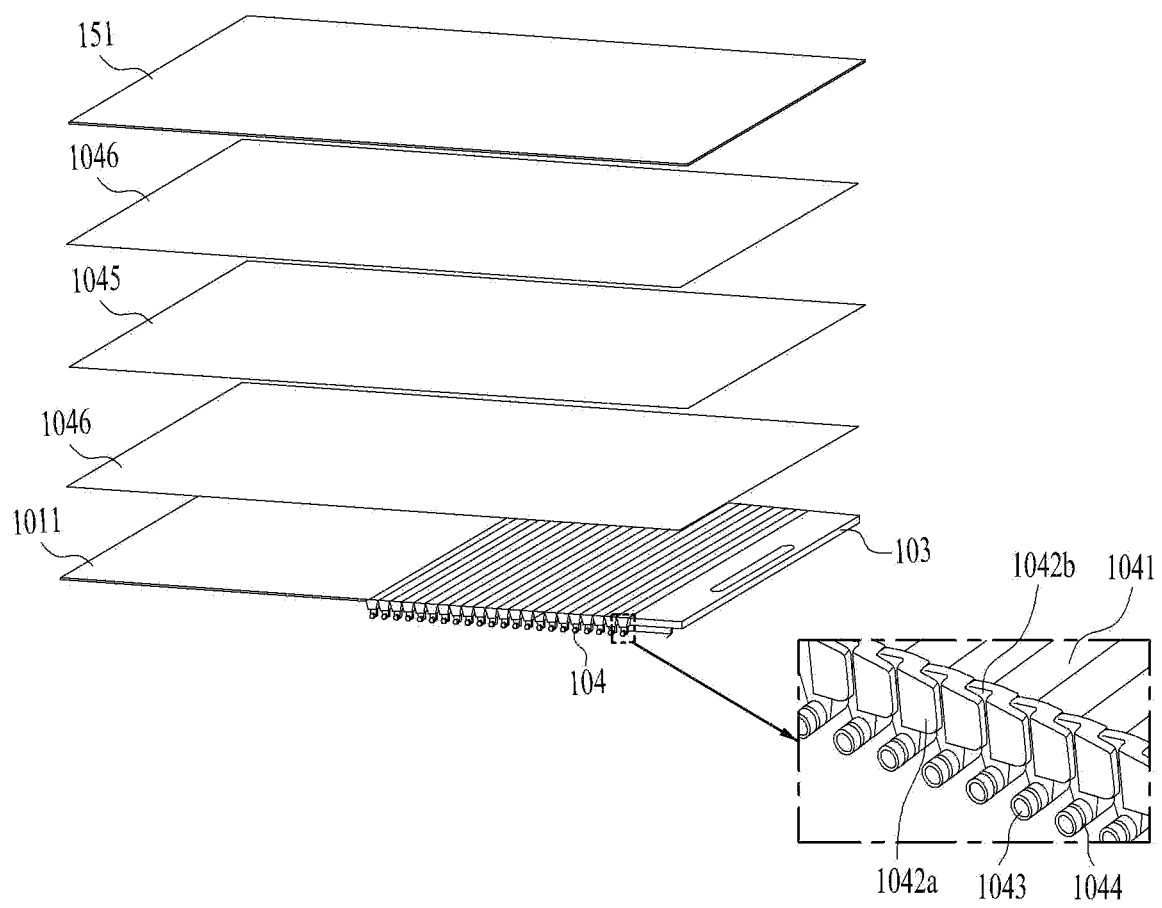
FIG. 9 is a view illustrating a display unit and a rolling plate of the mobile terminal in accordance with an embodiment.

FIG. 9 is a view illustrating a display unit 151 and a rolling plate 104 of the mobile terminal 100 in accordance with an embodiment. The rolling plate 104 may include multiple support bars 1041 extending in the third direction. The multiple support bars 1041 may be arranged side by side in the first direction and spaced apart from each other by a predetermined distance. Accordingly, even when the flexible display unit 151 is rolled around the roller 210 and is thus bent, interference between the support bars 1041 may be avoided. The support bars 1041 may be implemented with an injection molding material having a predetermined thickness for stiffness, and may include materials such as SUS or ferrosilicon (FeSi).

The multiple support bars 1041 may be directly attached to the rear surface of the display unit 151. However, this operation may take a long time and produce a lot of defects, resulting in poor productivity. In addition, directly processing the display unit 151 is highly likely to damage the display unit 151. Therefore, a rolling sheet 1045 to fix the multiple support bars 1041 may be further provided. The rolling sheet 1045 may include a metal material, and may employ a superelastic material that is bending-deformable and capable of recovering the flat state after the bending deformation. For example, a superelastic metal sheet such as a thin STS sheet of 0.05 mm or less may be used. An adhesive tape may be attached to both surfaces of the rolling sheet 1045 to bond the rolling sheet 1045 to the support bars 1041 and bond the rear surface of the display unit 151 to the rolling sheet 1045.

The rolling sheet 1045 may be provided with a kerf pattern in which multiple grooves extending in the third direction are formed in the first direction. The grooves in the kerf pattern may be formed between the multiple support bars 1041. The grooves may be formed on a surface of the rolling sheet 1045 to which the support bars 1041 are bonded. The kerf pattern may be formed in a wedge shape that is formed by being gradually narrowed from the surface portion of the rolling sheet 1045.

Instead of the rolling sheet 1045, an elastic material such as silicone may be disposed between the support bars 1041 to join neighboring support bars 1041. In this case, the angle between the support bars 1041 may be varied. The elastic connector may be bent at a position corresponding to the roller 210. When positioned on the front or rear of the mobile terminal, the elastic connector may be unfolded such that the support bars 1041 are disposed forming a flat surface.

The support bars 1041 may form a flat surface corresponding to the rear surface of the display unit 151. Alternatively, as shown in FIG. 8(b), the support bars 1041 may be formed in a shape having a predetermined curvature. The curved support bars 1041 may closely contact the curved surface of the roller 210 when the rolling plate 104 is rolled around the roller 210. Alternatively, one surface of the support bars 1041 in contact with the display unit 151 maintains a flat state, and the other surface thereof on the opposite side may include a curved surface corresponding to the curvature of the roller 210. In this case, the support bars 1041 may be thick at the ends thereof facing in the first and second directions and have the thinnest portion in the middle thereof.

The rolling plate 104 may be disposed at a position corresponding to the third region 151c and is rolled and bent around the roller 210. Thus, the rolling plate 104 may span over the front and rear surfaces. The rolling plate 104 is connected to the first front portion 1011 of the first frame 101 on the front side and connected to the slide frame 103 on the rear side. In order for the flexible display unit 151 to form a continuous surface without a step, the first front portion 1011 of the first frame 101 positioned on the rear surface of the first region 151a, the slide frame 103 positioned on the rear surface of the second region 151b, and the rolling plate 104 positioned on the rear surface of the third region 151c may be arranged such that the surfaces thereof in contact with the display unit 151 are at the same height. In particular, since the slide frame 103 moves on the rear of the mobile terminal 100 and moves in the same space as the rolling plate 104, the rolling plate 104 may have a thickness corresponding to the thickness of the slide frame 103.

Figure 10:
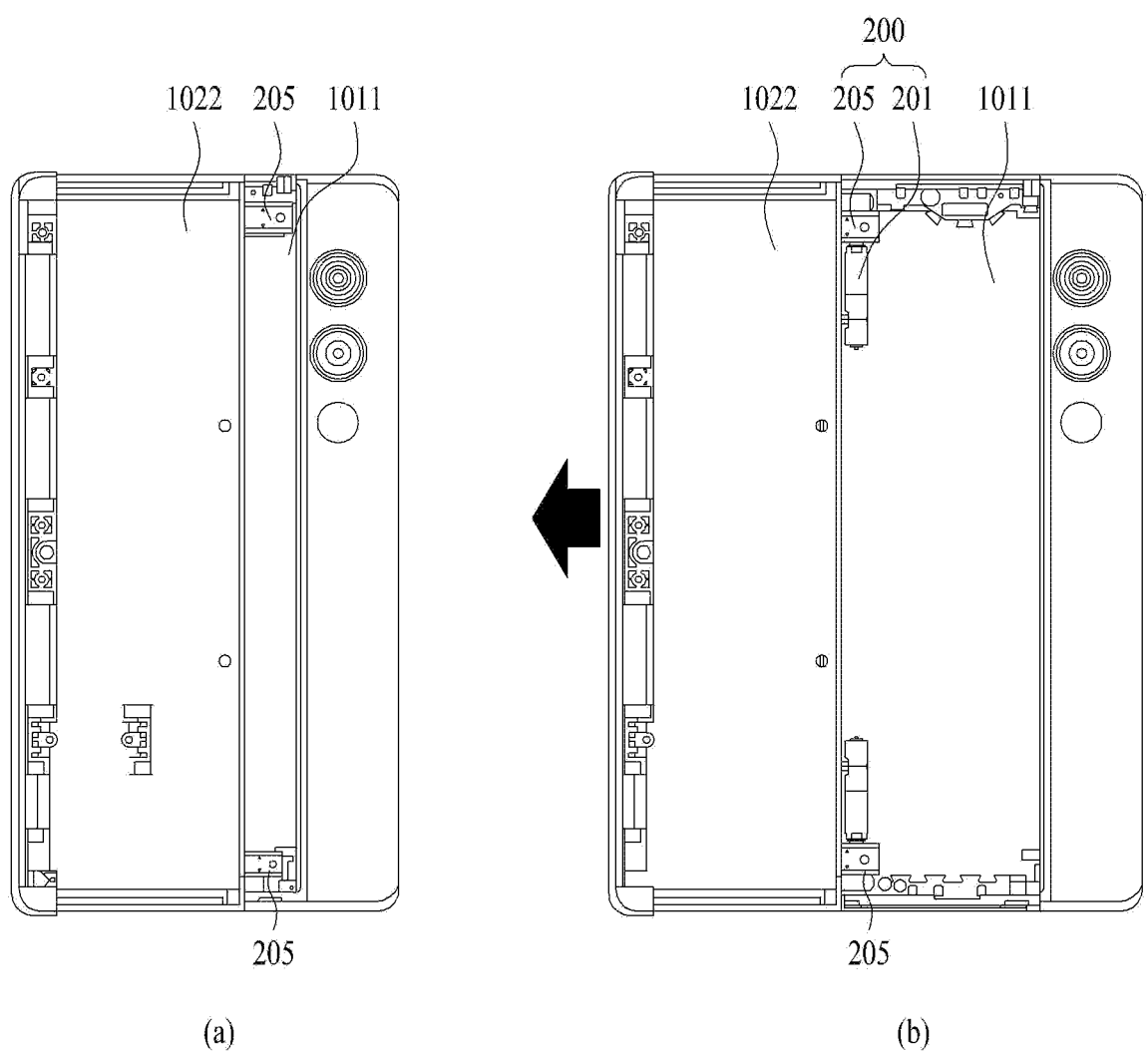
FIG. 10 is a rear view illustrating a driving unit and first and second frames according to another embodiment of the mobile terminal.

FIG. 10 is a rear view illustrating a driving unit 200 and first and second frames 101 and 102 according to another embodiment of the mobile terminal, and FIG. 11 is a front view of FIG. 10. The display unit 151 and the first rear portion 1012 are removed such that the driving unit 200 is arranged between the first frame 101 and the second frame 102, whereby the driving unit 200 slidably moves the second frame 102 with respect to the first frame 101.

In the driving unit 200 illustrated in FIG. 7, a pair of motors 201 may be disposed in parallel in the first direction, and a pinion gear 202 for transferring a rotational force of the pair of motors 201 may be disposed to be adjacent to one gear rack 205.

The driving unit 200 of this embodiment, as shown in FIGS. 10 and 11, may be disposed to be spaced apart from another driving unit in the third direction, and may be disposed symmetrically with respect to end portions of the third and fourth directions of the mobile terminal 100 to provide the second frame 102 with a uniform force. As shown in FIG. 10, the driving unit 200 may be arranged at the end portions of the third direction and the fourth direction (opposite direction of the third direction) to enhance space utility in the mobile terminal 100.

The gear rack 205 of the driving unit 200 may be coupled to the front surface of the second rear portion 1022 of the second frame 102, and the motor 201 and the pinion gear 202 of the driving unit 200 may be coupled to the rear surface of the first front portion 1011 of the first frame 101.

The first frame 101 and the second frame 102 may be spaced apart from each other or may be distorted when the second frame 102 slidably moves. To avoid this, the driving unit may further include a linear guide 230.

The linear guide 230 includes a guide rail 232 and a guide block 231. The guide block 231 may be fastened to the guide rail 232 to slidably move in the first direction or the second direction, and its movement in another direction other than the first direction or the second direction may be restricted, whereby the guide block 231 may be prevented from being detached from the guide rail 232.

The driving unit 200 of this embodiment is characterized in a single body with the linear guide 230. If the guide rail 232 and the gear rack 205 of the linear guide 230 are formed as one member to be longitudinally extended, the number of members may be reduced and configuration may be simplified.

FIG. 12 is a view illustrating one embodiment of the driving unit 200 of the mobile terminal 100. FIG. 12(a) is a perspective view illustrating the driving unit 200, and FIG. 12(b) is a sectional view illustrating that the driving unit 200 of FIG. 12(a) is coupled to the first frame 101 and the second frame 102.

Referring to FIG. 12(a), the gear rack 205 and the guide rail 232 may be disposed to be vertical to each other. Since a rotational shaft by which the pinion gear 202 is rotated is extended in the third direction, sawteeth of the rack, which moves by being engaged with those of the pinion gear 202, may be disposed toward the rear surface or the front surface of the mobile terminal 100. Therefore, the guide rail 232 coupled with the gear rack 205 in a vertical direction is disposed toward a side portion of the mobile terminal 100. The guide block 231 fastened to the guide rail 232, moving along the guide rail 232 may be fixed to the first side portion 1013 of the first frame 101.

As shown in FIG. 12(b), the first frame 101 may include the first front portion 1011 for supporting the first region 151a of the display unit 151 arranged on the front surface of the mobile terminal 100, and the first side portion 1013 for covering the end portion of the third direction and the end portion of the second direction.

When the second frame 102 moves in the first direction at the second state, since the second frame 102 is exposed to a rear direction of the first frame 101, the second frame 102 may include the first rear portion 1012 arranged in the rear direction of the mobile terminal 100, whereby the second frame 102 may be covered by the first rear portion 1012. The first rear portion 1012 may be arranged at an inner side of the second rear portion 1022 of the second frame 102.

The second frame 102 may include the second rear portion 1022 arranged in a rear direction. The second frame 102 includes the second rear portion 1022 to move the display frame 103 on the second rear portion 1022 and support the display unit 151 arranged on the rear surface of the mobile terminal.

The gear rack 205 is coupled to the second rear portion 1022, and is disposed to be engaged with the pinion gear 202 rotated by a driving force transferred from the motor 201 mounted on the first front portion 1011. The second frame 102 may include a second side portion disposed to be overlapped with the first side portion 1013. In this embodiment, the guide rail 232 disposed in the gear rack 205 in the vertical direction may serve as the second side portion. The guide block is coupled to the a lateral side portion of the first frame such that a first engagement portion of the guide block faces a lateral direction, the guide rail is disposed such that a second engagement portion of the guide rail faces the guide block, and the gear rack is positioned perpendicular to the guide rail such that teeth of the gear rack face toward a front or a rear of the mobile terminal.

The guide rail 232 includes a protruding lip extending along an edge of the guide rail configured to engage with an indented groove of the guide block to slidably secure the guide rail and guide block. The guide block 231 may include a indented groove into which the guide rail 232 is inserted. The indented groove is a groove having a shape corresponding to the cross section of the protruding lip of the guide rail 232 and extending in the first direction. The guide block 231 may move in the first direction or the second direction with the guide rail 232 inserted into the indented groove of the guide block 231. The indented groove may further include a locking portion protruding from the guide rail 232 and a locking groove extending in a first direction in a shape corresponding thereto so that the guide rail 232 is not separated from the indented groove of the guide block 231.

FIG. 13 is a view illustrating another embodiment of the driving unit 200 of the mobile terminal 100. FIG. 13(a) is a perspective view illustrating the driving unit 200, and FIG. 13(b) is a sectional view illustrating that the driving unit 200 of FIG. 13(a) is coupled to the first frame 101 and the second frame 102.

In the embodiment shown in FIG. 13, the guide rail 232 may be formed at the end portion of the gear rack 205 and therefore the guide block 231 may be fastened to the end portion of the third direction of the gear rack 205. The guide rail 232 does not need to be separately disposed in the vertical direction, and a grove may be formed at the end portion of the gear rack 205, whereby the guide block may move along the end portion of the gear rack without detachment. As shown in FIG. 13(b), the guide block 231 may be coupled to the first side portion 1013 of the first frame 101 such that a first engagement portion of the guide block 231 faces a lateral direction, and the gear rack 205 and the guide rail 232 may be coupled to the second rear portion 1022 of the second frame 102. the guide rail is disposed such that a second engagement portion of the guide rail 232 faces the guide block 231.

The gear rack 205 moves the second frame 102 to the first direction or the second direction by the rotational force transferred from the pinion gear 202, and the guide block 231 may guide movement of the gear rack 205 and the second frame 102 so that the gear rack 205 may not be detached or dislocated from the pinion gear 202.

Figure 14:
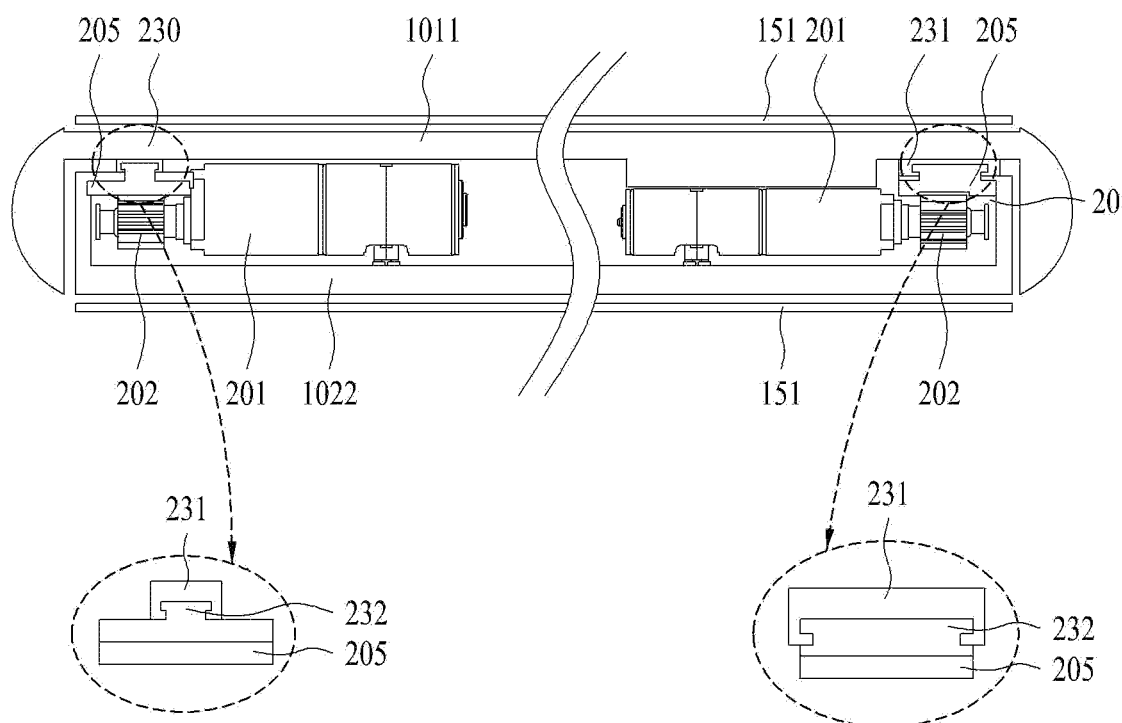
FIG. 14 is a view illustrating other embodiment of the driving unit of the mobile terminal.

FIG. 14 is a view illustrating other embodiment of the driving unit 200 of the mobile terminal 100. The gear rack 205 of this embodiment may be coupled to the front of the mobile terminal 100 and therefore disposed toward the rear direction. In order that the gear rack 205 is disposed toward the rear direction, the gear rack 205 should be coupled to the second front portion of the second frame 102. The front portion of the second gear rack 205 may be formed to partially overlap the first front portion, thereby avoiding interference with the motor 201.

As shown in FIG. 14, the second front portion may be configured at a size corresponding to that of the gear rack 205. The guide rail 232 of this embodiment may be formed on the rear surface of the gear rack 205, and therefore the guide block 231 may be arranged at the first front portion 1011 of the first frame 101. Since the guide rail 232, which is thin like the guide rail 232 arranged at the left side of FIG. 14, may be used, and a rear area of the gear rack 205 is wide, a width of the guide rail 232 may widely be formed as shown at the right side of FIG. 14, whereby a fastening force of the first frame 101 and the second frame 102 may be enhanced.

In order that the gear rack 205, the guide rail 232 and the guide block 231 are arranged between the pinion gear 202 and the first front portion 1011, the pinion gear 202 having a diameter smaller than a size of the motor 201 may be used, or a protrusion may be formed at the first front portion 1011 of the position where the motor 201 is mounted.

Since the mobile terminal 100 of the present disclosure may control a size of a screen if necessary, portability and usability may be fulfilled.

Also, since the mobile terminal 100 of the present disclosure does not concentrate a stress on a specific point, a damage caused by a concentrated stress of a display unit 151 may be reduced.

Also, since a gap of the display unit 151 is prevented from occurring when the second frame 102 moves, the display unit 151 of a flat state may be maintained.

Also, the mobile terminal 100 of the present disclosure includes a structure that guides the second frame 102 and the slide frame to allow them to move in parallel, whereby distortion may be avoided.

The above detailed description is to be considered in all respects as illustrative and not restrictive. The scope of the specification should be determined by reasonable interpretation of the appended claims and all change which comes within the equivalent scope of the present application are included in the scope of the present application.

What is claimed is:

1. A mobile terminal comprising:
   a first frame;
   a second frame configured to slidably move with respect to the first frame in a first direction or a second direction opposite the first direction; and
   a driving unit configured to move the second frame and comprising:
   a guide block coupled to the first frame;
   a motor coupled to the first frame;
   a pinion gear configured to be rotated by operation of the motor;
   a linear unit extending in the first direction and coupled to the second frame,
   wherein the linear unit includes:
      a gear rack portion moved in the first direction or the second direction in response to rotation of the pinion gear; and
      a guide rail portion coupled with the gear rack portion such that the guide rail portion faces in a different direction from the gear rack portion; and
   wherein the guide rail portion is engaged with the guide block and configured to pass through the guide block according to movement of the gear rack portion in response to the rotation of the pinion gear.

2. The mobile terminal of claim 1, wherein the driving unit one of a pair of driving units disposed to be spaced apart from each other in a third direction perpendicular to the first direction.

3. The mobile terminal of claim 2, wherein the pair of driving units are disposed to be symmetrical to each other.

4. The mobile terminal of claim 1, wherein the motor and the guide block are disposed to adjoin an end portion of the first frame.

5. The mobile terminal of claim 1, wherein:
   the gear rack portion is positioned such that teeth of the gear rack portion face toward a rear of the mobile terminal;
   the guide rail portion is coupled to the gear rack portion at a forward position with respect to the pinion gear; and
   the guide block, the guide rail portion, the gear rack portion, and the pinion gear are disposed to overlap one another in a front to rear direction of the mobile terminal.

6. The mobile terminal of claim 1, wherein the guide block includes a guide groove having a shape corresponding to that of the guide rail portion.

7. The mobile terminal of claim 6, wherein the guide rail portion includes a protruding lip extending along an edge of the guide rail portion configured to engage with an indented groove of the guide block to slidably secure the guide rail portion and guide block.

8. The mobile terminal of claim 1, wherein:
   the guide block is coupled to a lateral side portion of the first frame such that a first engagement portion of the guide block faces a lateral direction,
   the guide rail portion is disposed such that a second engagement portion of the guide rail portion faces the guide block, and the gear rack portion is positioned perpendicular to the guide rail portion such that teeth of the gear rack portion face toward a front or a rear of the mobile terminal.

9. The mobile terminal of claim 1, wherein the guide block includes a bearing or polyoxymethylene (POM) arranged to adjoin the guide rail portion.

10. The mobile terminal of claim 1, further comprising:
a slide frame configured to slidably move in the first direction or the second direction with respect to the second frame; and
a flexible display unit including a first region coupled to the first frame, a second region coupled to the slide frame, and a third region arranged between the first region and the second region and curved around the second frame.

11. A mobile terminal comprising:
a first frame;
a second frame configured to slidably move with respect to the first frame in a first direction or a second direction opposite the first direction; and
a driving unit configured to move the second frame and comprising:
a guide block coupled to the first frame;
a motor coupled to the first frame;
a pinion gear configured to be rotated by operation of the motor;
a linear unit extending in the first direction and coupled to the second frame,
wherein the linear unit includes:
a gear rack portion is moved in the first direction or the second direction in response to rotation of the pinion gear; and
a guide rail portion coupled with the gear rack portion such that the guide rail portion faces in an opposite direction from the rack gear portion, and
wherein the guide rail portion is engaged with the guide block and configured to pass through the guide block according to movement of the gear rack portion in response to the rotation of the pinion gear.

12. A mobile terminal comprising:
a first frame;
a second frame configured to slidably move with respect to the first frame in a first direction or a second direction opposite the first direction; and
a driving unit configured to move the second frame and comprising:
a guide block coupled to the first frame;
a motor coupled to the first frame;
a pinion gear configured to be rotated by operation of the motor;
a linear unit extending in the first direction and coupled to the second frame,
wherein the linear unit includes:
a gear rack portion is moved in the first direction or the second direction in response to rotation of the pinion gear; and
a guide rail portion coupled with the gear rack portion such that the guide rail portion faces in a perpendicular direction from the rack gear portion, and
wherein the guide rail portion is engaged with the guide block and configured to pass through the guide block according to movement of the gear rack portion in response to the rotation of the pinion gear.

* * * * *